(12) United States Patent
Iwashita et al.

(10) Patent No.: US 8,034,536 B2
(45) Date of Patent: Oct. 11, 2011

(54) RESIST COMPOSITION AND METHOD OF FORMING RESIST PATTERN

(75) Inventors: Jun Iwashita, Kawasaki (JP); Shogo Matsumaru, Kawasaki (JP); Sho Abe, Kawasaki (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 333 days.

(21) Appl. No.: 12/453,857

(22) Filed: May 26, 2009

(65) Prior Publication Data

US 2009/0297980 A1 Dec. 3, 2009

(30) Foreign Application Priority Data

May 28, 2008 (JP) ................. P2008-139709

(51) Int. Cl.
*G03F 7/004* (2006.01)
*G03F 7/30* (2006.01)

(52) U.S. Cl. ............. 430/270.1; 430/325; 430/326; 430/910

(58) Field of Classification Search ......... 430/270.1, 430/325, 326, 910
See application file for complete search history.

(56) References Cited

U.S. PATENT DOCUMENTS

| | | | |
|---|---|---|---|
| 5,945,517 | A | 8/1999 | Nitta et al. |
| 6,153,733 | A | 11/2000 | Yukawa et al. |
| 7,074,543 | B2 | 7/2006 | Iwai et al. |
| 7,456,311 | B2 * | 11/2008 | Hatakeyama et al. ...... 560/220 |
| 7,528,279 | B2 * | 5/2009 | Hatakeyama et al. ...... 560/220 |
| 2007/0129532 | A1 * | 6/2007 | Hatakeyama et al. ...... 528/326 |

FOREIGN PATENT DOCUMENTS

| | | |
|---|---|---|
| JP | 9-208554 | 8/1997 |
| JP | 11-35551 | 2/1999 |
| JP | 11-35552 | 2/1999 |
| JP | 11-35573 | 2/1999 |
| JP | 11-322707 | 11/1999 |
| JP | 2003-241385 | 8/2003 |
| JP | 2009286721 A * | 12/2009 |
| WO | 2004/074242 | 9/2004 |

OTHER PUBLICATIONS

Shigeyuki Iwasa et al., "Novel negative photoresist based on polar alicyclic polymers for ArF excimer laser lithography", SPIE Advances in Resist Technology and Processing XIV, vol. 3333, pp. 417-424, 1998.
Will Conley et al., "Negative Photoresist for 157 nm Microlithography; A Progress Report", SPIE Advances in Resist Technology and Processing XIX, vol. 4690, pp. 94-100, 2002.

* cited by examiner

*Primary Examiner* — John Chu
(74) *Attorney, Agent, or Firm* — Wenderoth, Lind & Ponack, L.L.P.

(57) ABSTRACT

A novel resist composition and method of forming a resist pattern that can be used in lithography applications. The resist composition includes a base component (A) that exhibits changed solubility in an alkali developing solution under action of acid, and an acid generator component (B) that generates acid upon exposure, wherein the base component (A) contains a polymer compound (A1) having a structural unit (a0) represented by general formula (a0-1) shown below, wherein $R^1$ represents a hydrogen atom, an alkyl group of 1 to 5 carbon atoms or a fluorinated alkyl group of 1 to 5 carbon atoms, $R^2$ and $R^3$ each independently represents a hydrogen atom or an alkyl group that may include an oxygen atom at an arbitrary position, or $R^2$ and $R^3$ are bonded together to form an alkylene group, and W represents a cyclic alkylene group that may include an oxygen atom at an arbitrary position.

[Chemical Formula 1]

(a0-1)

8 Claims, No Drawings

RESIST COMPOSITION AND METHOD OF FORMING RESIST PATTERN

TECHNICAL FIELD

The present invention relates to a novel resist composition and a method of forming a resist pattern.

Priority is claimed on Japanese Patent Application No. 2008-139709, filed May 28, 2008, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use exposure light source having a wavelength shorter than these excimer lasers, such as $F_2$ excimer lasers, electron beam, EUV (extreme ultraviolet radiation), and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist is used, which includes a base component that exhibits changed solubility in an alkali developing solution under action of acid and an acid generator that generates acid upon exposure. A resin (base resin) is typically used as the base component of a chemically amplified resist.

For example, a chemically amplified positive resist contains, as a base resin, a resin which exhibits increased solubility in an alkali developing solution under action of acid, and during the formation of a resist pattern, when acid is generated from the acid generator upon exposure, the action of that acid causes an increase in the solubility of the base resin in an in an alkali developing solution (for example, see Patent Document 1).

Furthermore, a chemically amplified negative resist typically contains, as a base resin, a resin that is soluble in an alkali developing solution (an alkali-soluble resin), and also contains a cross-linker. In this resist composition, when acid is generated from the acid generator upon exposure during the formation of a resist pattern, the action of that acid causes the base resin and the cross-linker to react, causing a decrease in the solubility of the base resin in an alkali developing solution (for example, see Non-Patent Documents 1 and 2).

Resins that contain structural units derived from (meth) acrylate esters within the main chain (acrylic resins) are now mainly used as the base resins for resists that use ArF excimer laser lithography, as they exhibit excellent transparency in the vicinity of 193 nm. Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth) acrylate" is a generic term that includes either or both of the acrylate having a hydrogen atom bonded to the α-position and the methacrylate having a methyl group bonded to the α-position.

[Patent Document 1]
Japanese Unexamined Patent Application, First Publication No. 2003-241385
[Non-Patent Reference 1]
SPIE Advances in Resist Technology and Processing XIV, Vol. 3333, pages 417 to 424 (1998)
[Non-Patent Reference 2]
SPIE Advances in Resist Technology and Processing XIX, Vol. 4690, pages 94 to 100 (2002)

DISCLOSURE OF INVENTION

Problems to be Solved by the Invention

With the expectation of further progress in lithography techniques and further expansion in the potential fields of application for such lithography techniques, there are growing demands for the development of novel materials that can be used in lithography applications.

The present invention takes the above circumstances into consideration, with an object of providing a novel resist composition and a method of forming a resist pattern that can be used in lithography applications.

Means to Solve the Problems

The present invention has the aspects described below.

Namely, a first aspect of the present invention is a resist composition including a base component (A) that exhibits changed solubility in an alkali developing solution under action of acid, and an acid generator component (B) that generates acid upon exposure, wherein the base component (A) contains a polymer compound (A1) having a structural unit (a0) represented by general formula (a0-1) shown below.

[Chemical Formula 1]

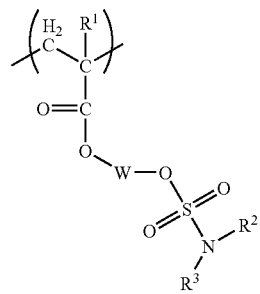

(a0-1)

wherein $R^1$ represents a hydrogen atom, an alkyl group of 1 to 5 carbon atoms or a fluorinated alkyl group of 1 to 5 carbon atoms, $R^2$ and $R^3$ each independently represents a hydrogen atom or an alkyl group that may include an oxygen atom at an arbitrary position, or $R^2$ and $R^3$ may be bonded together to form an alkylene group, and W represents a cyclic alkylene group that may include an oxygen atom at an arbitrary position.

A second aspect of the present invention is a method of forming a resist pattern, including: forming a resist film on a substrate using the resist composition according to the first aspect described above, conducting exposure of the resist film, and developing the resist film to form a resist pattern.

In the present descriptions and the claims, the term "structural unit" refers to a monomer unit that contributes to the formation of a polymer compound (a resin, polymer or copolymer).

A "structural unit derived from an acrylate ester" refers to a structural unit which is formed by the cleavage of the ethylenic double bond of an acrylate ester.

The term "acrylate ester" is a generic term that includes the acrylate ester having a hydrogen atom bonded to the carbon atom on the α-position, and acrylate esters having a substituent (an atom other than a hydrogen atom or a group) bonded to the carbon atom on the α-position. Examples of the substituent include a lower alkyl group, a halogenated lower alkyl group, or a hydroxyalkyl group.

Unless specified otherwise, the "α-position" (the carbon atom on the α-position) of a structural unit derived from an acrylate ester refers to the carbon atom having the carbonyl group bonded thereto.

The term "exposure" is used as a general concept that includes irradiation with any form of radiation.

Unless specified otherwise, the term "alkyl group" includes linear, branched and cyclic monovalent saturated hydrocarbon groups. This definition also applies to alkyl groups within an "alkoxycarbonyl group"

A "lower alkyl group" is an alkyl group having 1 to 5 carbon atoms.

The term "aliphatic" is a relative concept used in relation to the term "aromatic", and defines a group or compound or the like that has no aromaticity.

The term "alkylene group" includes linear, branched and cyclic divalent saturated hydrocarbon groups, unless specified otherwise.

A "halogenated alkyl group" describes a group in which some or all of the hydrogen atoms of an alkyl group have been substituted with halogen atoms. Examples of the halogen atom include a fluorine atom, chlorine atom, bromine atom and iodine atom.

A "hydroxyalkyl group" is a group in which some or all of the hydrogen atoms of an alkyl group have been substituted with hydroxyl groups.

Effect of the Invention

According to the present invention, there can be provided a novel resist composition and a method of forming a resist pattern that can be used in lithography applications.

BEST MODE FOR CARRYING OUT THE INVENTION

Resist Composition

The resist composition of the present invention includes a base component (A) (hereafter, referred to as "component (A)") which exhibits changed solubility in an alkali developing solution under action of acid, and an acid-generator component (B) (hereafter, referred to as "component (B)") which generates acid upon exposure.

With respect to a resist film formed using the resist composition, when a selective exposure is conducted during formation of a resist pattern, acid is generated from the component (B), and the generated acid acts on the component (A) to change the solubility of the component (A) in an alkali developing solution. As a result, the solubility of the exposed portions in an alkali developing solution is changed, whereas the solubility of the unexposed portions in an alkali developing solution remains unchanged. Therefore, the exposed portions are dissolved and removed by alkali developing in the case of a positive resist composition, whereas the unexposed portions are dissolved and removed in the case of a negative resist composition, and hence, a resist pattern can be formed.

Here, compositions which change from being insoluble in the alkali developing solution to being soluble are positive compositions, whereas compositions which change from being soluble in the alkali developing solution to being insoluble are positive compositions.

The resist composition of the present invention may be either a negative resist composition or a positive resist composition. A negative resist composition is preferred, and in such cases, the composition also includes a cross-linker component (C) (hereafter, referred to as "component (C)").

<Component (A)>
[Structural Unit (a0)]

The polymer compound (A1) includes a structural unit (a0) represented by general formula (a0-1) shown above.

The alkyl group of 1 to 5 carbon atoms for $R^1$ is preferably a linear or branched alkyl group, and specific examples thereof include a methyl group, ethyl group, propyl group, isopropyl group, n-butyl group, isobutyl group, tert-butyl group, pentyl group, isopentyl group and neopentyl group.

The fluorinated alkyl group of 1 to 5 carbon atoms for $R^1$ is preferably a linear or branched fluorinated alkyl group, and specific examples thereof include a monofluoromethyl group, difluoromethyl group, trifluoromethyl group, perfluoroethyl group, perfluoropropyl group, perfluoroisopropyl group, perfluorobutyl group, perfluoroisobutyl group, perfluoro-tert-butyl group, perfluoropentyl group, perfluoroisopentyl group and perfluoroneopentyl group.

From the viewpoint of industrial availability, $R^1$ is preferably a hydrogen atom, a methyl group or a trifluoromethyl group, and a hydrogen atom or a methyl group is particularly desirable.

The alkyl groups for $R^2$ and $R^3$ may be linear, branched or cyclic groups. Of these, the linear and branched alkyl groups for $R^2$ and $R^3$ may include a cyclic alkyl group as a substituent. Furthermore, the cyclic alkyl groups for $R^2$ and $R^3$ may include a linear or branched alkyl group, a fluorine atom, a fluorinated alkyl group of 1 to 5 carbon atoms substituted with one or more fluorine atoms, or an oxygen atom (=O) or the like as a substituent.

As the linear or branched alkyl group, alkyl groups of 1 to 5 carbon atoms are preferred, and specific examples include a methyl group, ethyl group, n-propyl group, i-propyl group, n-butyl group, i-butyl group, t-butyl group, 2-methyl-2-butyl group, 3-methyl-2-butyl group, 1-pentyl group, 2-pentyl group and 3-pentyl group. Furthermore, these linear or branched alkyl groups may include a cyclic alkyl group as a substituent.

Examples of the cyclic alkyl group include a cyclopropyl group, cyclobutyl group, cyclopentyl group, 1-methyl-1-cyclopentyl group, 1-ethyl-1-cyclopentyl group, cyclohexyl group, 1-methyl-1-cyclohexyl group, 1-ethyl-1-cyclohexyl group, 1-methyl-1-cycloheptyl group, 1-ethyl-1-cycloheptyl group, 1-methyl-1-cyclooctyl group, 1-ethyl-1-cyclooctyl group, bicyclo[2.2.1]heptan-2-yl group, 1-adamantyl group, 2-adamantyl group, 2-methyl-2-adamantyl group, and 2-ethyl-2-adamantyl group.

The alkyl groups for $R^2$ and $R^3$ may include an oxygen atom at an arbitrary position. The expression "include an oxygen atom" means that an oxygen atom (—O—) is introduced into the carbon chain of the alkyl group. Examples of alkyl groups that include an oxygen atom include acetal-type acid-dissociable, dissolution-inhibiting groups such as the alkoxyalkyl groups described below.

The alkylene group formed in those cases where $R^2$ and $R^3$ are bonded together is preferably a linear or branched alkylene group, and is more preferably a linear alkylene group. The alkylene group preferably contains 1 to 5 carbon atoms, and specific examples thereof include an ethanediyl group, propane-1,3-diyl group and butane-1,4-diyl group.

In those cases where the resist composition of the present invention is a negative resist composition, at least one of $R^2$ and $R^3$ (for example, $R^2$) is preferably a hydrogen atom, and compositions in which $R^2$ and $R^3$ are both hydrogen atoms are particularly desirable.

In those cases where the resist composition of the present invention is a positive resist composition, at least one of $R^2$ and $R^3$ is preferably an alkyl group that may include an oxygen atom at an arbitrary position, and that alkyl group is preferably an acid-dissociable, dissolution-inhibiting group. In such cases, specific examples of the structural unit (a0) include structural units represented by a general formula (a0-1-4) shown below.

[Chemical Formula 2]

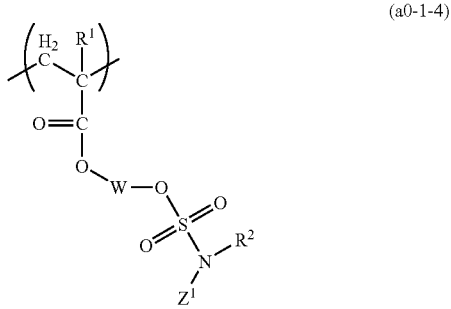

(a0-1-4)

wherein $R^1$, $R^2$ and W are as defined above for $R^1$, $R^2$ and W in general formula (a0-1), and $Z^1$ represents an acid-dissociable, dissolution-inhibiting group.

An "acid-dissociable, dissolution-inhibiting group" is a group which, during formation of a resist pattern using the resist composition, has an alkali dissolution-inhibiting effect that renders the entire polymer compound (A1) insoluble in an alkali developing solution prior to exposure, but then dissociates under the action of the acid generated from the component (B) upon exposure, causing the entire polymer compound (A1) to undergo an increase in solubility within the alkali developing solution.

There are no particular limitations on the acid-dissociable, dissolution-inhibiting group in the structural unit (a0), provided the group corresponds with an alkyl group that may include an oxygen atom at an arbitrary position, and any of the groups that have been proposed for use within the base components of conventional positive chemically amplified resist compositions may be selected as appropriate. Examples of widely used acid-dissociable, dissolution-inhibiting groups include tertiary alkyl groups and acetal-type acid-dissociable, dissolution-inhibiting groups such as alkoxyalkyl groups.

A tertiary alkyl group is an alkyl group that contains a tertiary carbon atom, and in those cases where at least one of $R^2$ and $R^3$ in the structural unit (a0) is a tertiary alkyl group, the tertiary carbon atom of the tertiary alkyl group is bonded to the nitrogen atom at the terminal of the sulfamoyloxy group ($OSO_2N$ group). In this tertiary alkyl group, the action of the acid generated from the component (B) upon exposure during formation of a resist pattern causes a cleavage of the bond between the nitrogen atom at the terminal of the sulfamoyloxy group and the tertiary carbon atom.

Examples of the tertiary alkyl group include branched tertiary alkyl groups and tertiary alkyl groups that contain an aliphatic cyclic group.

Examples of the branched tertiary alkyl groups include groups represented by a formula —$C(R^{71})(R^{72})(R^{73})$. In this formula, $R^{71}$ to $R^{73}$ each independently represents a linear alkyl group of 1 to 5 carbon atoms. The group represented by —$C(R^{71})(R^{72})(R^{73})$ preferably contains from 4 to 8 carbon atoms, and specific examples include a tert-butyl group, 2-methyl-2-butyl group, 2-methyl-2-pentyl group, and 3-methyl-3-pentyl group.

A tert-butyl group is particularly preferred.

The aliphatic cyclic group may or may not have a substituent. Examples of the substituent include lower alkyl groups of 1 to 5 carbon atoms, a fluorine atom, fluorinated lower alkyl groups of 1 to 5 carbon atoms that have been substituted with one or more fluorine atoms, and an oxygen atom (=O).

The aliphatic cyclic group may be a hydrocarbon group formed solely from carbon and hydrogen (namely, an alicyclic group), or a heterocyclic group in which a portion of the carbon atoms that constitute the ring structure of an alicyclic group have been substituted with a hetero atom such as an oxygen atom, nitrogen atom or sulfur atom. As the aliphatic cyclic group, an alicyclic group is preferred.

The aliphatic cyclic group may be either saturated or unsaturated, but in terms of achieving superior transparency to ArF excimer lasers and the like, and also achieving excellent resolution and depth of focus (DOF) and the like, a saturated group is preferred.

The aliphatic cyclic group may be either a monocyclic group or a polycyclic group, but is preferably a polycyclic group.

Furthermore, the number of carbon atoms within the aliphatic cyclic group is preferably within a range from 5 to 15.

Examples of monocyclic aliphatic cyclic groups include groups in which one or more hydrogen atoms have been removed from a cycloalkane. Specific examples include groups in which one or more hydrogen atoms have been removed from cyclopentane or cyclohexane, and groups in which two hydrogen atoms have been removed from cyclohexane are particularly desirable.

Examples of polycyclic aliphatic cyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane.

Of these, groups in which two hydrogen atoms have been removed from cyclohexane, adamantane, norbornane or tetracyclododecane are readily available industrially, and are therefore preferred. Of these groups, groups in which two hydrogen atoms have been removed from adamantane or norbornane are particularly preferred.

Examples of tertiary alkyl groups that contain an aliphatic cyclic group include (i) groups having a tertiary carbon atom within the ring structure of an aliphatic cyclic group, and (ii) groups containing an aliphatic cyclic group, and a branched alkylene group having a tertiary carbon atom which is bonded to the aliphatic cyclic group.

Specific examples of (i) include groups represented by general formulas (1-1) to (1-9) shown below.

Specific examples of (ii) include groups represented by general formulas (2-1) to (2-6) shown below.

[Chemical Formula 3]

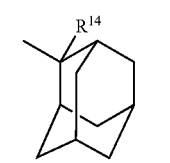
(1-1)

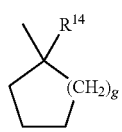
(1-2)

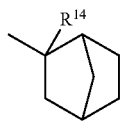
(1-3)

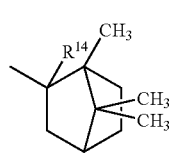
(1-4)

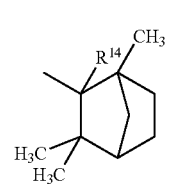
(1-5)

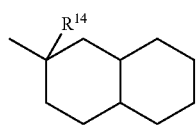
(1-6)

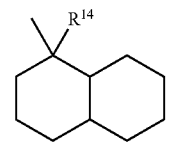
(1-7)

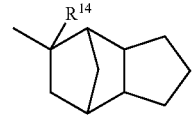
(1-8)

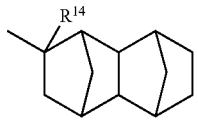
(1-9)

wherein $R^{14}$ represents an alkyl group, and g represents an integer of 0 to 8.

[Chemical Formula 4]

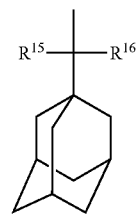
(2-1)

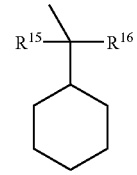
(2-2)

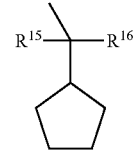
(2-3)

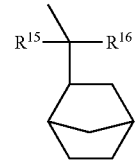
(2-4)

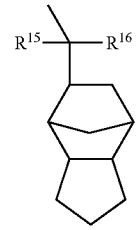
(2-5)

(2-6)

wherein $R^{15}$ and $R^{16}$ each independently represents an alkyl group.

As the alkyl groups for $R^{14}$ to $R^{16}$, lower alkyl groups are preferred, and linear or branched alkyl groups are also preferred. Specific examples include a methyl group, ethyl group, propyl group, isopropyl group, n-butyl group, isobutyl group, tert-butyl group, pentyl group, isopentyl group, and neopentyl group. Of these, a methyl group, ethyl group or n-butyl group is preferred, and a methyl group or ethyl group is more preferred.

g is preferably an integer of 0 to 5, more preferably an integer of 1 to 3, and is most preferably either 1 or 2.

Of the above groups, specific examples of groups of formula (1-2) include a 1-methyl-1-cyclobutyl group, 1-ethyl-1-cyclobutyl group, 1-isopropyl-1-cyclobutyl group, 1-methyl-1-cyclopentyl group, 1-ethyl-1-cyclopentyl group, 1-isopropyl-1-cyclopentyl group, 1-methyl-1-cyclohexyl group, 1-ethyl-1-cyclohexyl group, 1-isopropyl-1-cyclohexyl group, 1-methyl-1-cycloheptyl group, 1-ethyl-1-cycloheptyl group, 1-isopropyl-1-cycloheptyl group, 1-methyl-1-cyclooctyl group, and 1-ethyl-1-cyclooctyl group.

An "acetal-type acid-dissociable, dissolution-inhibiting group" represented by $R^2$ or $R^3$ in the structural unit (a0) is bonded to the nitrogen atom at the terminal of the sulfamoyloxy group ($OSO_2N$ group). In this acetal-type acid-dissociable, dissolution-inhibiting group, the action of the acid generated from the acid generator component upon exposure during formation of a resist pattern using the resist composition causes a cleavage of the bond between the nitrogen atom and the acetal-type acid-dissociable, dissolution-inhibiting group.

Examples of the acetal-type acid-dissociable, dissolution-inhibiting group include the same acetal-type acid-dissociable, dissolution-inhibiting groups as those exemplified in relation to a structural unit (a1) described below.

The cyclic alkylene group represented by W, which may include an oxygen atom at an arbitrary position, may be either a monocyclic group or a polycyclic group. The number of carbon atoms within the alkylene group is preferably within a range from 3 to 20, and is more preferably from 5 to 12. Specific examples of the alkylene group include a cyclopropanediyl group, cyclobutane-1,2-diyl group, cyclobutane-1,3-diyl group, cyclopentane-1,2-diyl group, cyclopentane-1,3-diyl group, cyclohexane-1,2-diyl group, cyclohexane-1,3-diyl group, cyclohexane-1,4-diyl group, bicyclo[2.2.1]heptane-2,3-diyl group, bicyclo[2.2.1]heptane-2,5-diyl group, 7-oxabicyclo[2.2.1]heptane-2,5-diyl group, bicyclo[2.2.1]heptane-2,6-diyl group, 7-oxabicyclo[2.2.1]heptane-2,6-diyl group, adamantane-1,3-diyl group, and adamantane-1,2-diyl group.

More specific examples of the structural unit (a0) include structural units represented by formulas (a0-1-10) to (a0-1-72) shown below.

In the following formulas, Me represents a methyl group.

[Chemical Formula 5]

(a0-1-10)
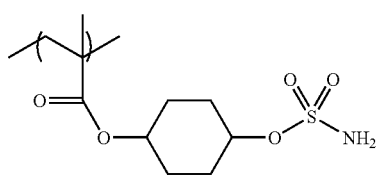

(a0-1-11)
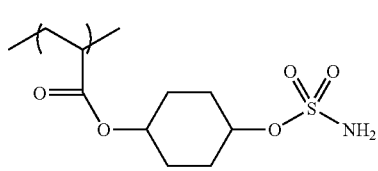

(a0-1-12)
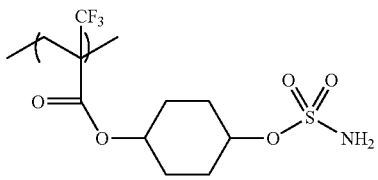

(a0-1-13)
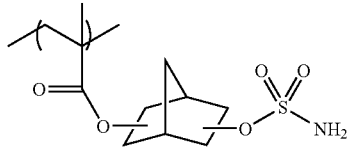

(a0-1-14)
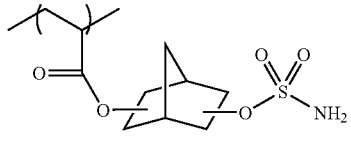

(a0-1-15)
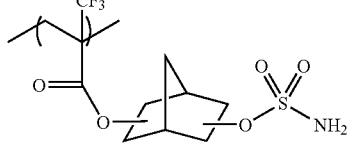

(a0-1-16)
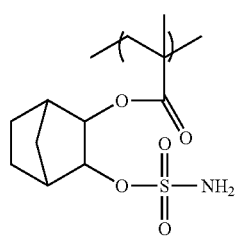

(a0-1-17)
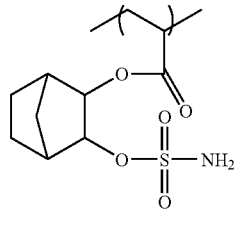

(a0-1-18)
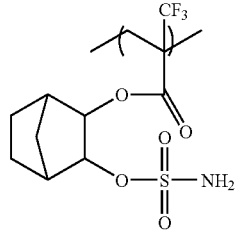

(a0-1-19)
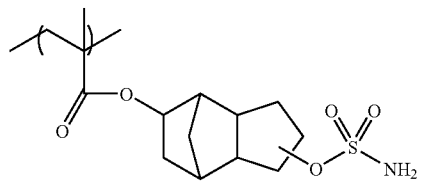

(a0-1-20)
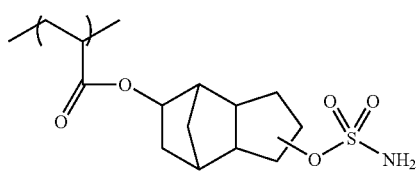
(a0-1-21)
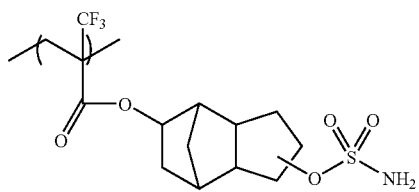
(a0-1-22)
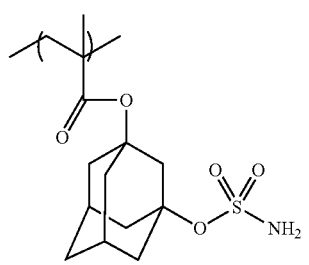
(a0-1-23)
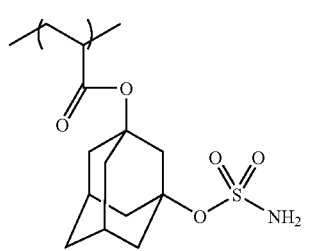
(a0-1-24)
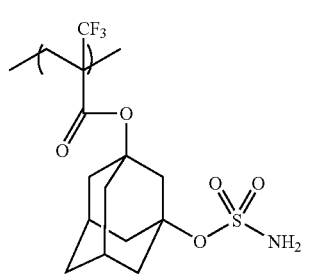
[Chemical Formula 6]
(a0-1-25)
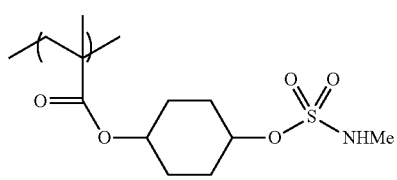
(a0-1-26)
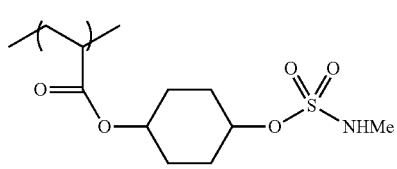
(a0-1-27)
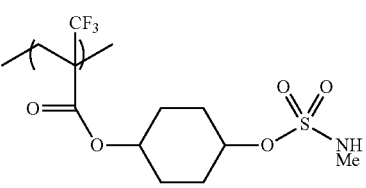
(a0-1-28)
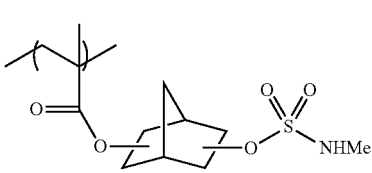
(a0-1-29)
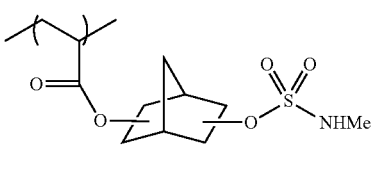
(a0-1-30)
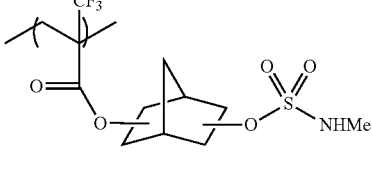
(a0-1-31)
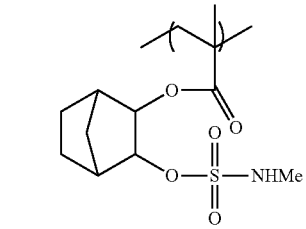
(a0-1-32)
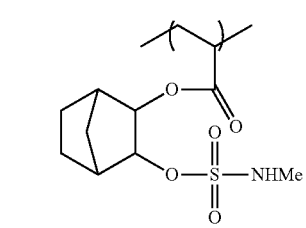
(a0-1-33)
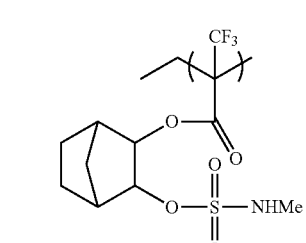
(a0-1-34)
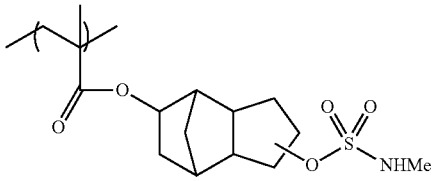

(a0-1-35)
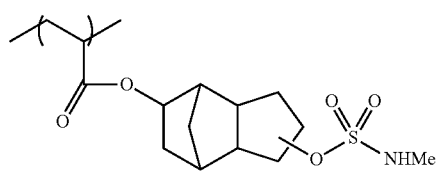
(a0-1-36)
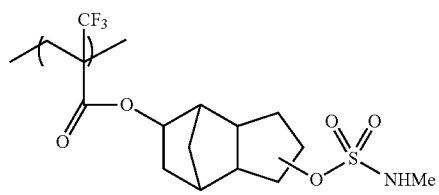
(a0-1-37)
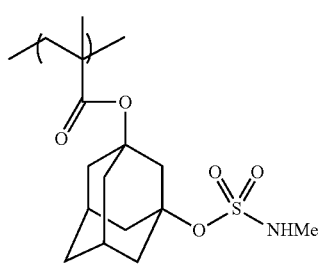
(a0-1-38)
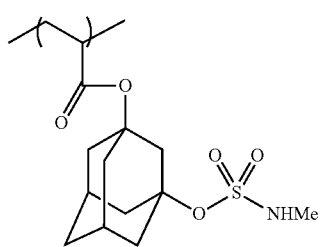
(a0-1-39)
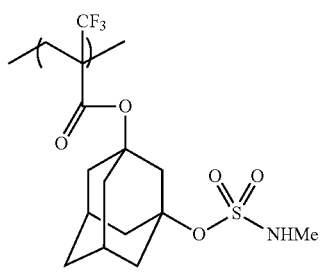
[Chemical Formula 7]
(a0-1-40)
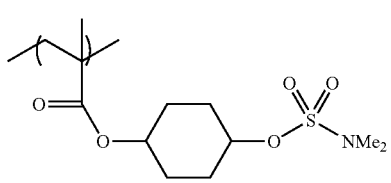
(a0-1-41)
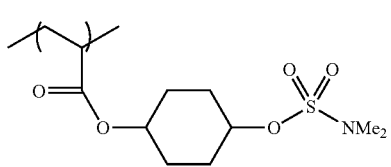
(a0-1-42)
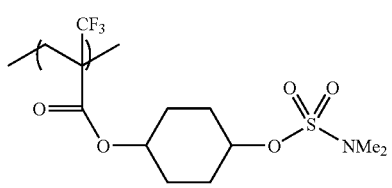
(a0-1-43)
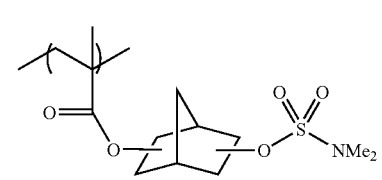
(a0-1-44)
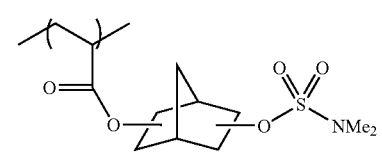
(a0-1-45)
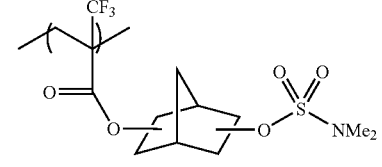
(a0-1-46)
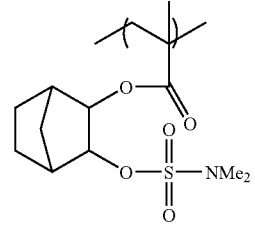
(a0-1-47)
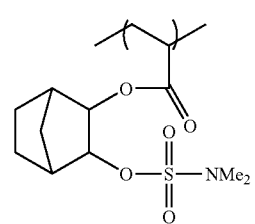
(a0-1-48)
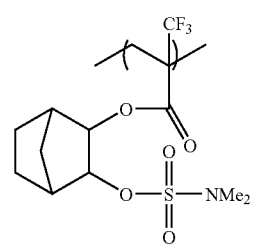
(a0-1-49)
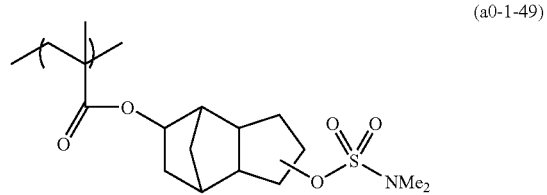

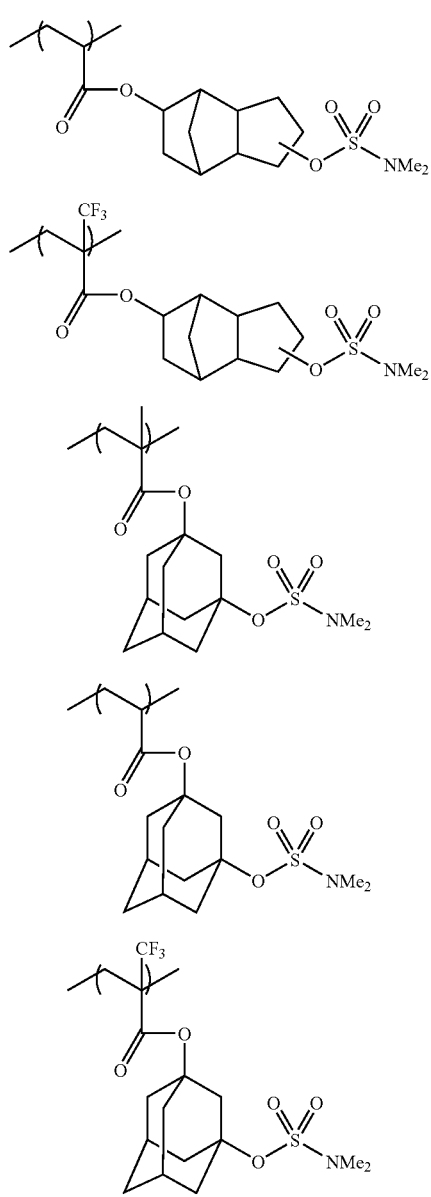
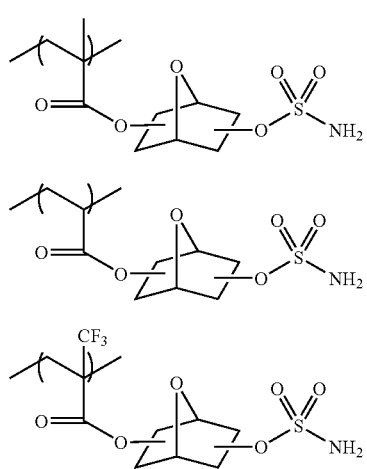
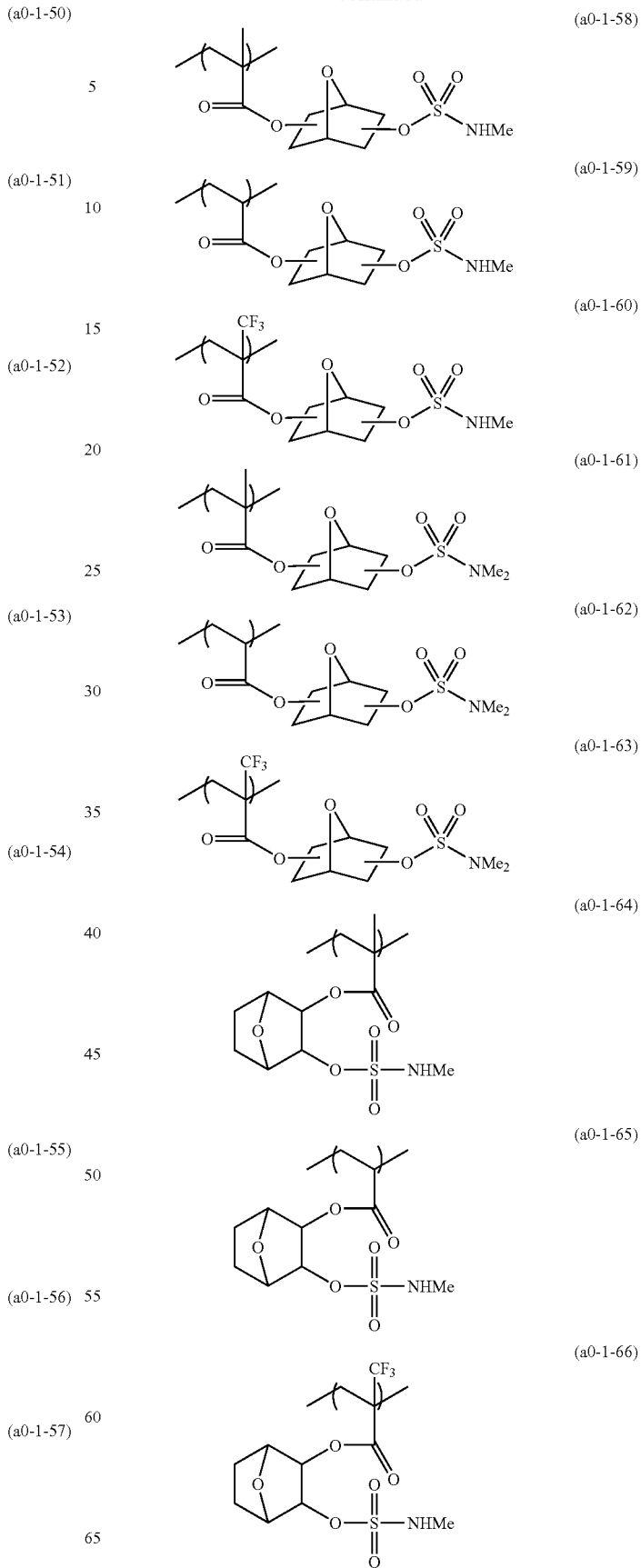

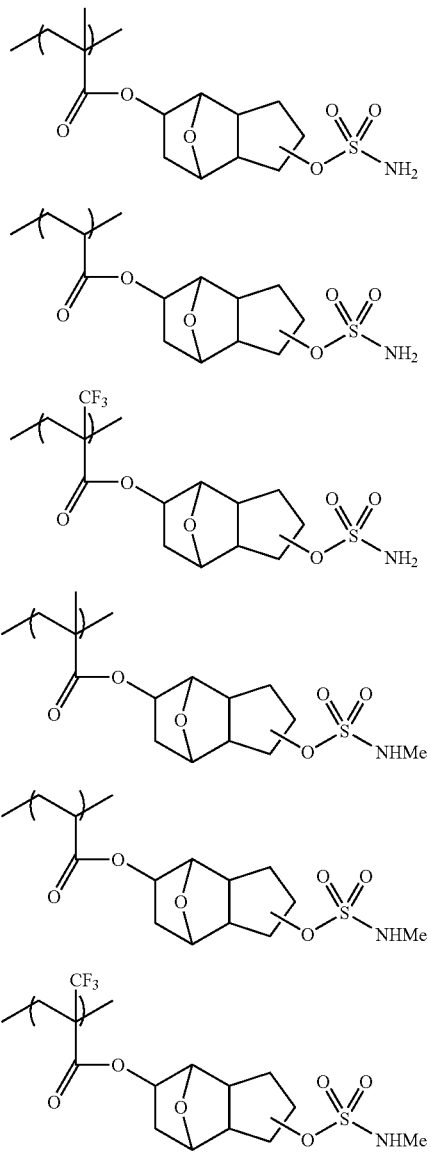

In the polymer compound (A1), the structural unit (a0) may be either a single type of structural unit or a combination of two or more different types.

Furthermore, the polymer compound (A1) may be a polymer formed solely from the structural unit (a0), a copolymer formed from two or more different structural units (a0), or a copolymer that also includes one or more other structural units.

In those cases where the polymer compound (A1) is a copolymer that includes one or more other structural units besides the structural unit (a0), the proportion of the structural unit (a0) within the polymer compound (A1), relative to the total of all the structural units that constitute the polymer compound (A1), is preferably within a range from 10 to 80 mol %, more preferably from 15 to 80 mol %, still more preferably from 20 to 70 mol %, and most preferably from 20 to 60 mol %. By making this proportion at least as large as the lower limit of the above-mentioned range, a pattern can be formed easily using a resist composition prepared from the polymer compound (A1), whereas by making the proportion not more than the upper limit of the above-mentioned range, a good balance can be achieved with the other structural units.

In those cases where the polymer compound (A1) is a copolymer that includes one or more other structural units besides the structural unit (a0), examples of those other structural units include a structural unit (a1), structural unit (a2), structural unit (a3), structural unit (a4) and structural unit (a5) described below. Furthermore, examples of the structural unit (a3) include a structural unit (a'3) and a structural unit (a"3) described below.

Of these other structural units, the structural units for combination with the structural unit (a0) may be selected appropriately from the structural units (a1) to (a5) in accordance with factors such as the intended application of the resist composition and the properties desired of the composition.

For example, in those cases where the resist composition is a negative-type composition, as the structural unit for combination with the structural unit (a0), the structural unit (a3) and/or structural unit (a4) is preferred, at least one structural unit selected from the group consisting of the structural unit (a'3), structural unit (a"3) and structural unit (a4) is more preferred, and the structural unit (a4) is still more preferred.

Moreover, in those cases where the resist composition is a positive-type composition, as the structural unit for combination with the structural unit (a0), any of the structural units (a1) to (a5) may be used, although the structural unit (a1) and/or structural unit (a2) is preferred.

[Structural Unit (a1)]

The structural unit (a1) is a structural unit derived from an acrylate ester containing an acid-dissociable, dissolution-inhibiting group.

As the acid-dissociable, dissolution-inhibiting group in the structural unit (a1), any of the groups that have been proposed as acid-dissociable, dissolution-inhibiting groups for the base resins of chemically amplified resists can be used, provided the group has an alkali dissolution-inhibiting effect which, during formation of a resist pattern using the resist composition, renders the entire polymer compound (A1) insoluble in an alkali developing solution prior to dissociation, and then following dissociation by action of acid generated from the component (B) upon exposure, increases the solubility of the entire component (A1) in the alkali developing solution. Generally, groups that form either a cyclic or chain-like tertiary alkyl ester with the carboxyl group of the (meth)acrylic acid, and acetal-type acid-dissociable, dissolution-inhibiting groups such as alkoxyalkyl groups are widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include the same tertiary alkyl groups as those exemplified above for the acid-dissociable, dissolution-inhibiting group in the structural unit (a0).

An "acetal-type acid-dissociable, dissolution-inhibiting group" generally substitutes a hydrogen atom at the terminal of an alkali-soluble group such as a carboxyl group or hydroxyl group, and is therefore bonded to an oxygen atom. When acid is generated upon exposure, the action of this acid breaks the bond between the acetal-type acid-dissociable, dissolution-inhibiting group and the oxygen atom to which the acetal-type, acid-dissociable, dissolution-inhibiting group is bonded.

Examples of acetal-type acid-dissociable, dissolution-inhibiting groups include groups represented by general formula (p1) shown below.

[Chemical Formula 9]

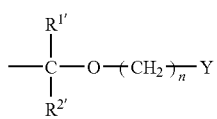

(p1)

wherein $R^{1\prime}$ and $R^{2\prime}$ each independently represents a hydrogen atom or a lower alkyl group, n represents an integer of 0 to 3, and Y represents a lower alkyl group or an aliphatic cyclic group.

In the above formula, n is preferably an integer of 0 to 2, more preferably 0 or 1, and is most preferably 0.

Examples of the lower alkyl group for $R^{1\prime}$ and $R^{2\prime}$ include the same lower alkyl groups as those exemplified above for R, although a methyl group or ethyl group is preferred, and a methyl group is the most desirable.

In the present invention, it is preferable that at least one of $R^{1\prime}$ and $R^{2\prime}$ is a hydrogen atom. That is, it is preferable that the acid-dissociable, dissolution-inhibiting group (p1) is a group represented by general formula (p1-1) shown below.

[Chemical Formula 10]

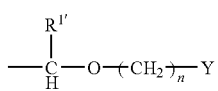

(p1-1)

wherein $R^{1\prime}$, n and Y are as defined above.

Examples of the lower alkyl group represented by Y include the same lower alkyl groups as those exemplified above for R.

As the aliphatic cyclic group represented by Y, any of the multitude of monocyclic or polycyclic aliphatic cyclic groups that have been proposed for conventional ArF resists and the like can be appropriately selected for use. Examples include the same groups exemplified above in relation to the "aliphatic cyclic group".

Further, examples of the acetal-type, acid-dissociable, dissolution-inhibiting group include groups represented by general formula (p2) shown below.

[Chemical Formula 11]

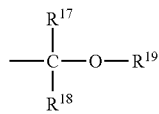

(p2)

wherein $R^{17}$ and $R^{18}$ each independently represents a linear or branched alkyl group or a hydrogen atom, and $R^{19}$ represents a linear, branched or cyclic alkyl group, or alternatively, $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ or $R^{18}$ preferably has 1 to 15 carbon atoms, may be either linear or branched, is preferably an ethyl group or methyl group, and is most preferably a methyl group.

It is particularly desirable that either $R^{17}$ and $R^{18}$ are both hydrogen atoms, or one of $R^{17}$ and $R^{18}$ is a hydrogen atom and the other is a methyl group. Groups in which $R^{17}$ and $R^{18}$ are both hydrogen atoms are particularly desirable.

$R^{19}$ represents a linear, branched or cyclic alkyl group, which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and is most preferably an ethyl group.

When $R^{19}$ represents a cyclic group, the group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from either a monocycloalkane such as cyclopentane or cyclohexane, or a polycycloalkane such as adamantane, norbornane, isobornane, tricyclodecane or tetracyclododecane. Of these, a group in which one or more hydrogen atoms have been removed from adamantane is preferred.

In the above formula, $R^{17}$ and $R^{19}$ may each independently represent a linear or branched alkylene group (preferably an alkylene group of 1 to 5 carbon atoms), wherein $R^{19}$ and $R^{17}$ are bonded together, and preferably wherein the terminal of $R^{19}$ is bonded to the terminal of $R^{17}$.

In such a case, a cyclic group is formed by $R^{17}$, $R^{19}$, the oxygen atom bonded to $R^{19}$, and the carbon atom that is bonded to the oxygen atom and $R^{17}$. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), the use of one or more units selected from the group consisting of structural units represented by general formula (a1-0-1) shown below and structural units represented by general formula (a1-0-2) shown below is preferred.

[Chemical Formula 12]

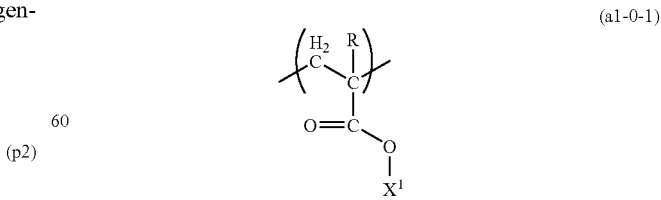

(a1-0-1)

wherein, R represents a hydrogen atom, a lower alkyl group or a halogenated lower alkyl group, and $X^1$ represents an acid-dissociable, dissolution-inhibiting group.

[Chemical Formula 13]

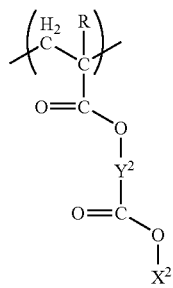

(a1-0-2)

wherein R represents a hydrogen atom, a lower alkyl group or a halogenated lower alkyl group, $X^2$ represents an acid-dissociable, dissolution-inhibiting group, and $Y^2$ represents an alkylene group or a divalent aliphatic cyclic group.

In general formula (a1-0-1), the lower alkyl group or halogenated lower alkyl group represented by R are as defined above for the lower alkyl group or halogenated lower alkyl group that may be bonded to the α-position of an aforementioned acrylate ester.

$X^1$ is not particularly limited as long as it is an acid-dissociable, dissolution-inhibiting group, and examples include the aforementioned tertiary alkyl ester-type acid-dissociable, dissolution-inhibiting groups and acetal-type acid-dissociable, dissolution-inhibiting groups.

In general formula (a1-0-2), R is as defined above.

$X^2$ is the same as $X^1$ in formula (a1-0-1).

$Y^2$ is preferably an alkylene group of 1 to 4 carbon atoms or a divalent aliphatic cyclic group, wherein examples of this aliphatic cyclic group include the same groups as those exemplified above in the description of the "aliphatic cyclic group" with the exception that two or more hydrogen atoms have been removed from the cyclic structure.

Specific examples of the structural unit (a1) include structural units represented by general formulas (a1-1) to (a1-4) shown below.

[Chemical Formula 14]

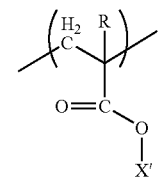

(a1-1)

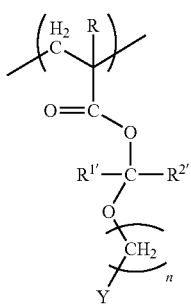

(A1-2)

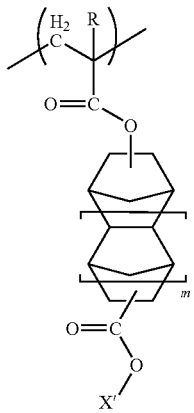

(a1-3)

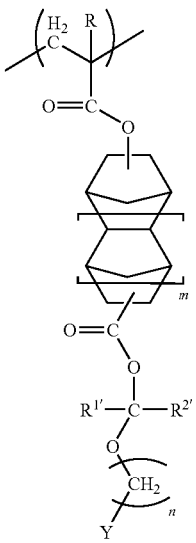

(a1-4)

wherein X' represents a tertiary alkyl ester-type acid-dissociable, dissolution-inhibiting group, Y represents a lower alkyl group of 1 to 5 carbon atoms or an aliphatic cyclic group, n represents an integer of 0 to 3, m represents either 0 or 1, R is as defined above; and $R^{1'}$ and $R^{2'}$ each independently represents a hydrogen atom or a lower alkyl group of 1 to 5 carbon atoms.

At least one of $R^{1'}$ and $R^{2'}$ is preferably a hydrogen atom, and units in which $R^{1'}$ and $R^{2'}$ are both hydrogen atoms are particularly preferred. n is preferably either 0 or 1.

X' represents the same tertiary alkyl ester-type acid-dissociable, dissolution-inhibiting groups as those exemplified above for $X^1$.

Examples of the aliphatic cyclic group for Y include the same groups as those exemplified above in the description of the "aliphatic cyclic group".

Specific examples of structural units represented by the above general formulas (a1-1) to (a1-4) are shown below.

[Chemical Formula 15]

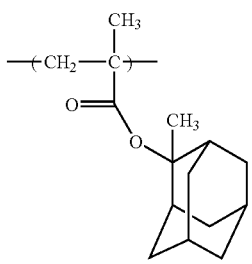

(a1-1-1)

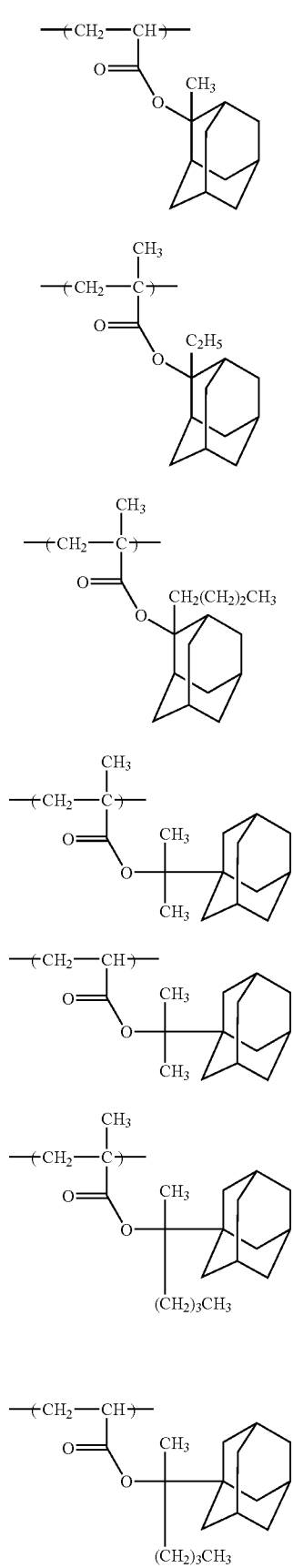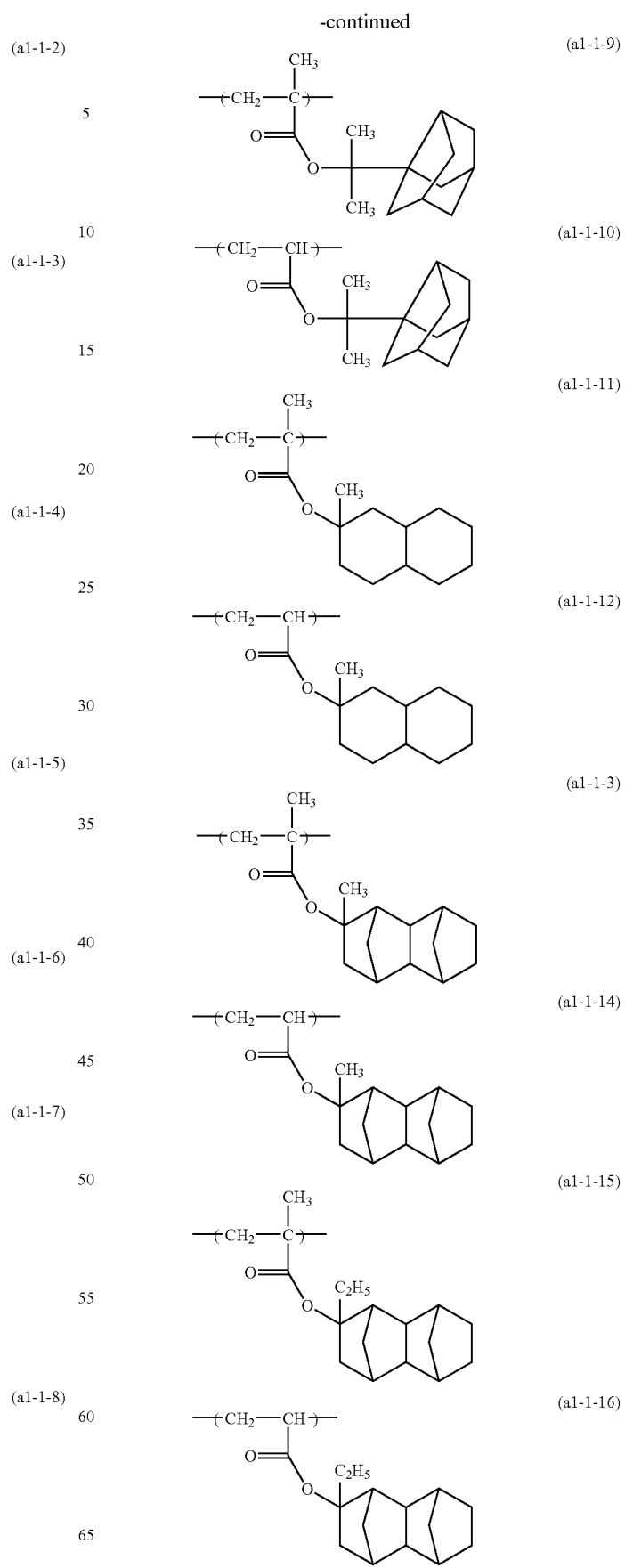

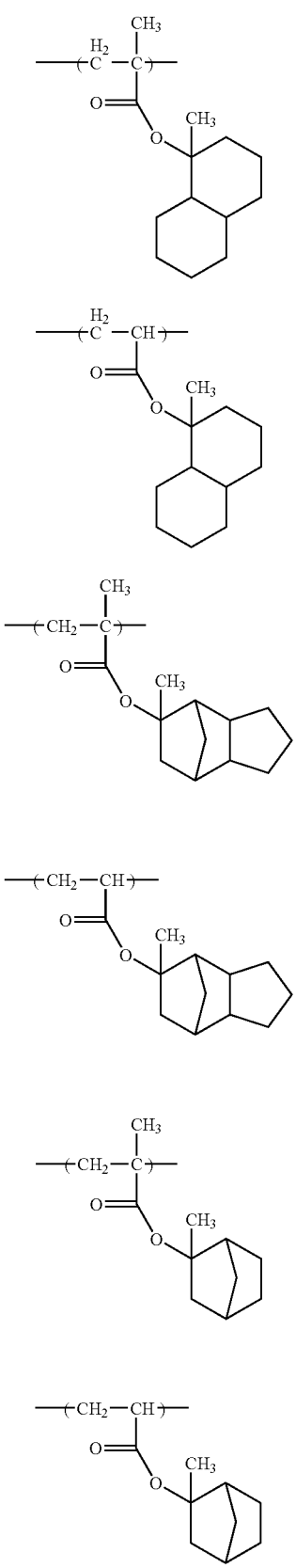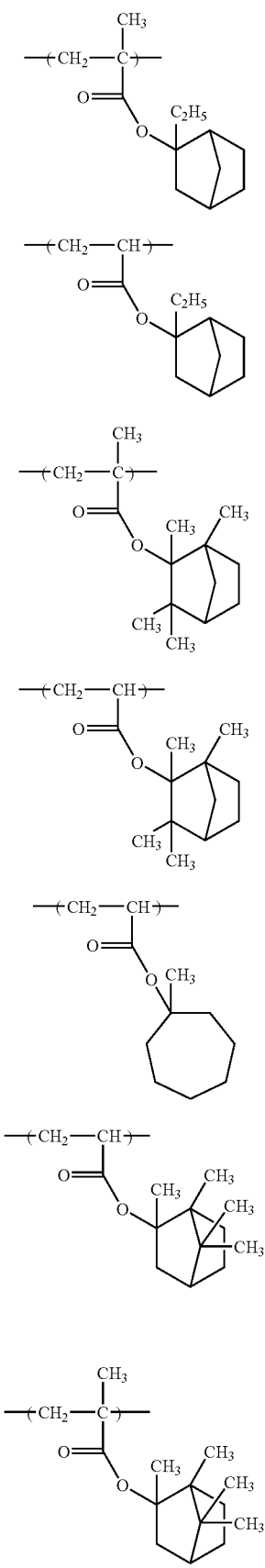

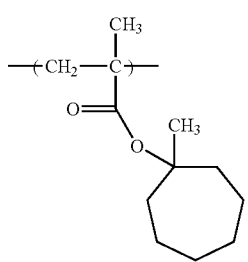 (a1-1-30)
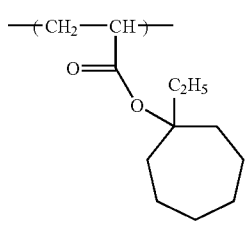 (a1-1-31)
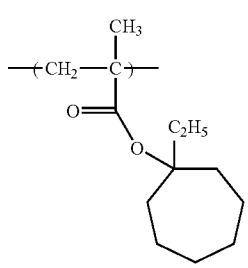 (a1-1-32)
[Chemical Formula 17]
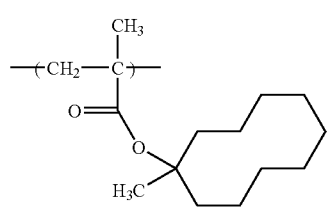 (a1-1-33)
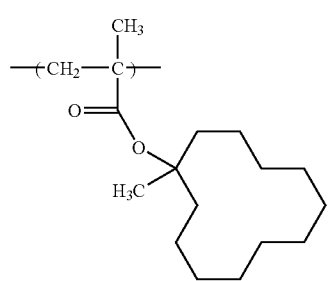 (a1-1-34)
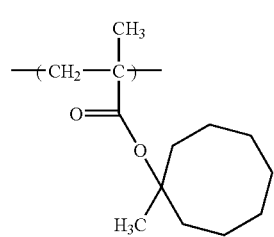 (a1-1-35)
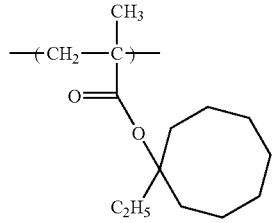 (a1-1-36)
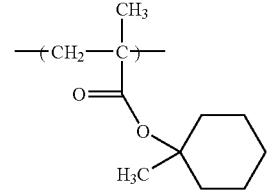 (a1-1-37)
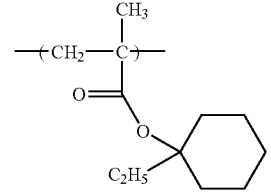 (a1-1-38)
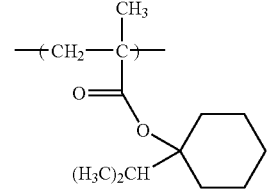 (a1-1-39)
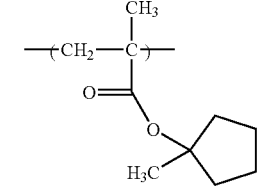 (a1-1-40)
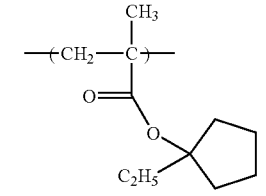 (a1-1-41)
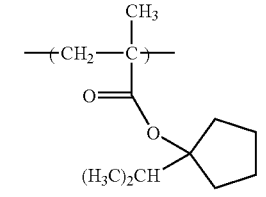 (a1-1-42)
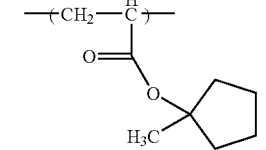 (a1-1-43)

US 8,034,536 B2
29
-continued
(a1-1-44)
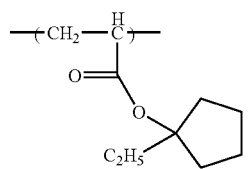
(a1-1-45)
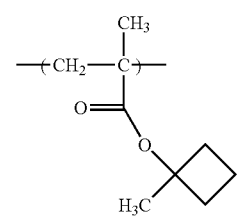
(a1-1-46)
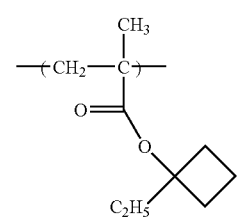
(a1-1-47)
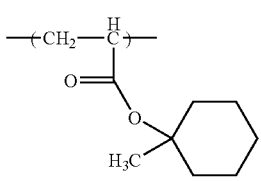
(a1-1-48)
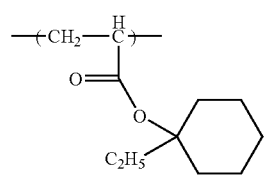
(a1-1-49)
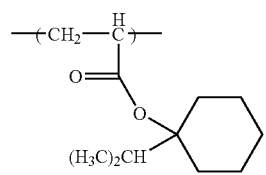
(a1-1-50)
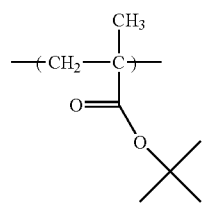
(a1-1-51)
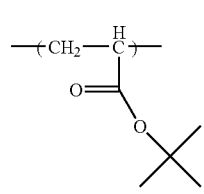
30
-continued
(a1-1-52)
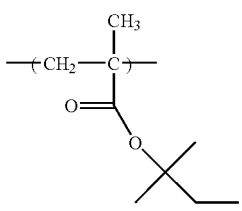
(a1-1-53)
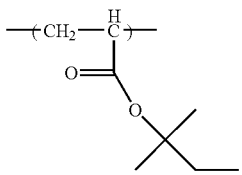
[Chemical Formula 18]
(a1-2-1)
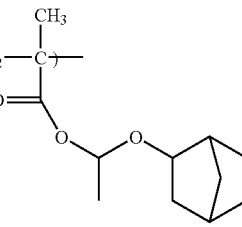
(a1-2-2)
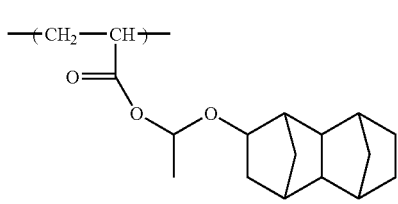
(a1-2-3)
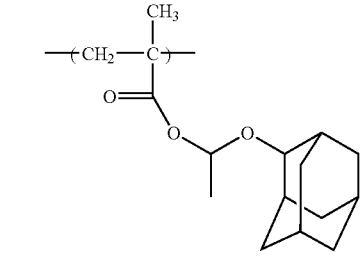
(a1-2-4)
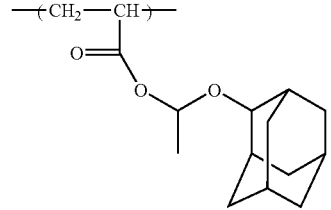
(a1-2-5)
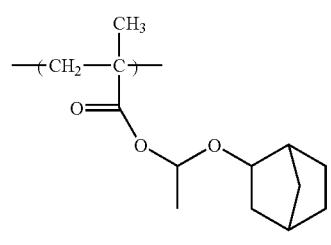

-continued
(a1-2-6)
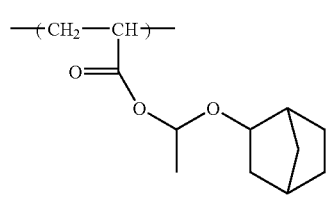
[Chemical Formula 19]
(a1-2-7)
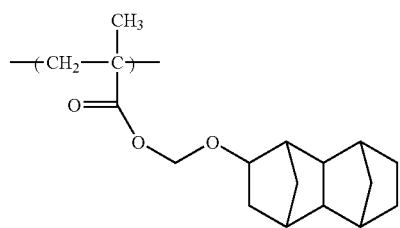
(a1-2-8)
(a1-2-9)
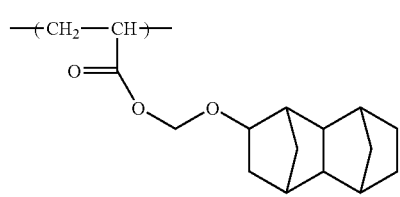
(a1-2-10)
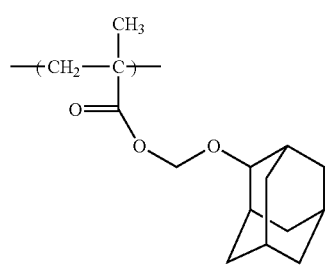
(a1-2-11)
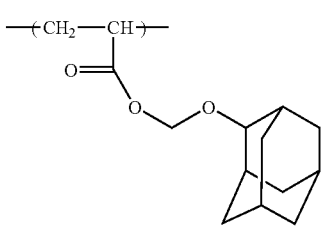
(a1-2-12)
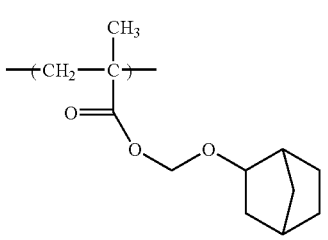
-continued
(a1-2-13)
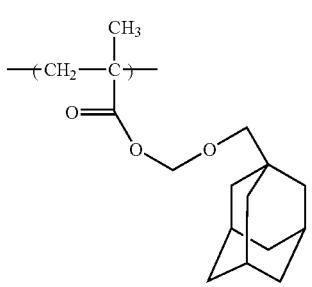
(a1-2-14)
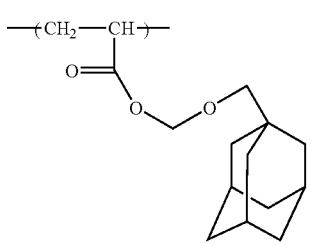
(a1-2-15)
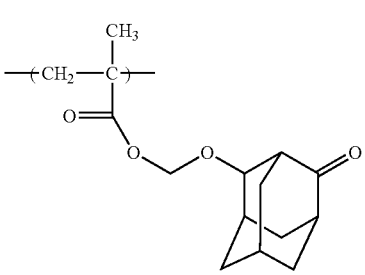
(a1-2-16)
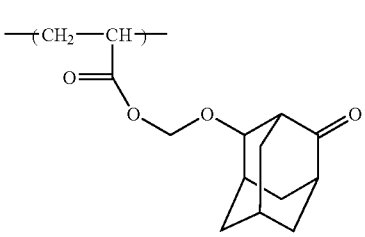
(a1-2-17)
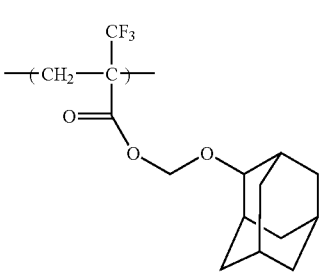
(a1-2-18)
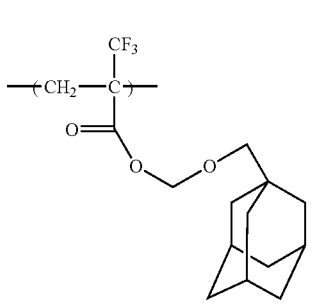

(a1-2-19) 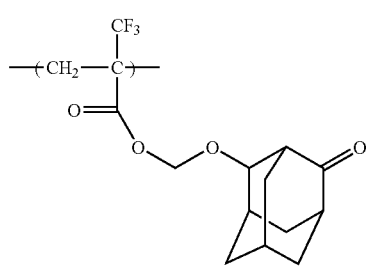
(a1-2-20) 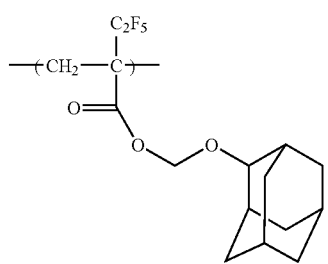
[Chemical Formula 20]
(a1-2-21) 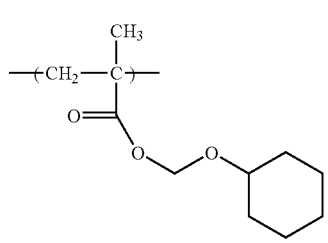
(a1-2-22) 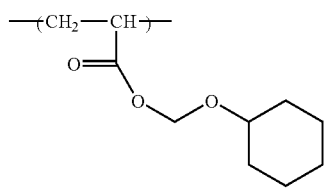
(a1-2-23) 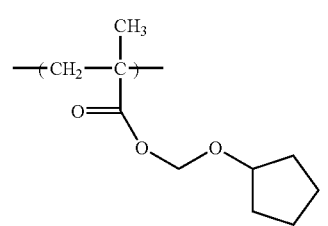
(a1-2-24) 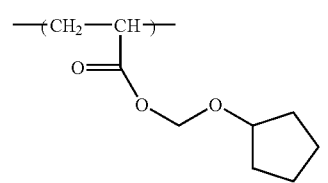
(a1-2-25) 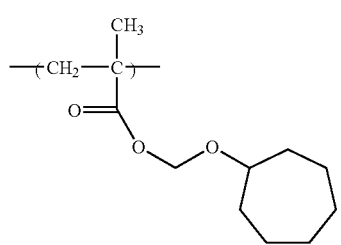
(a1-2-26) 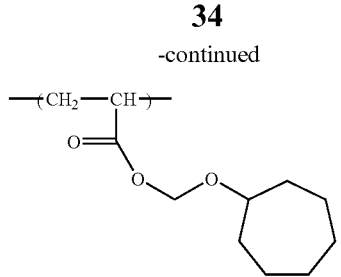
(a1-2-27) 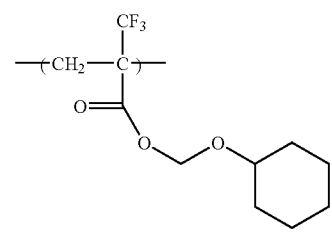
(a1-2-28) 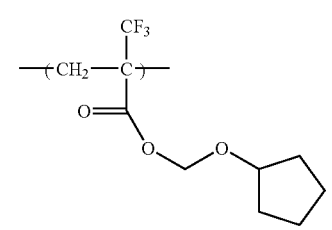
(a1-2-29) 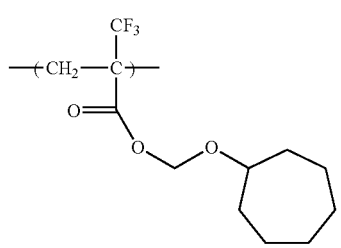
(a1-2-30) 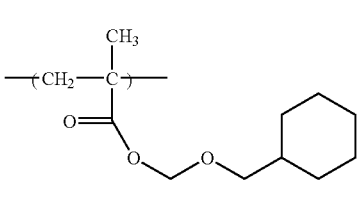
(a1-2-31) 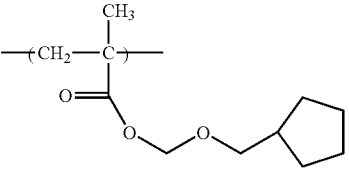
[Chemical Formula 21]
(a1-2-32) 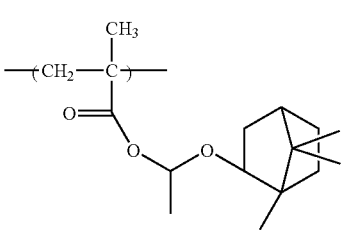

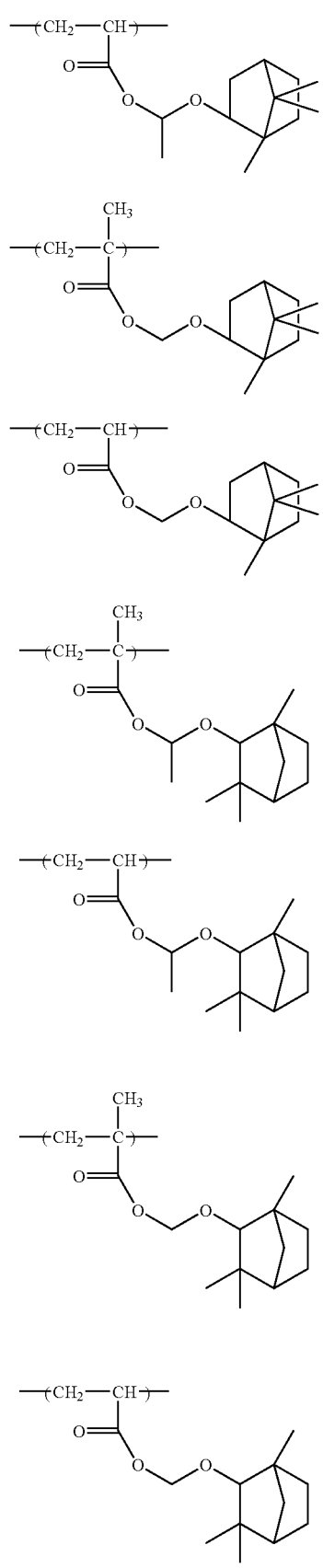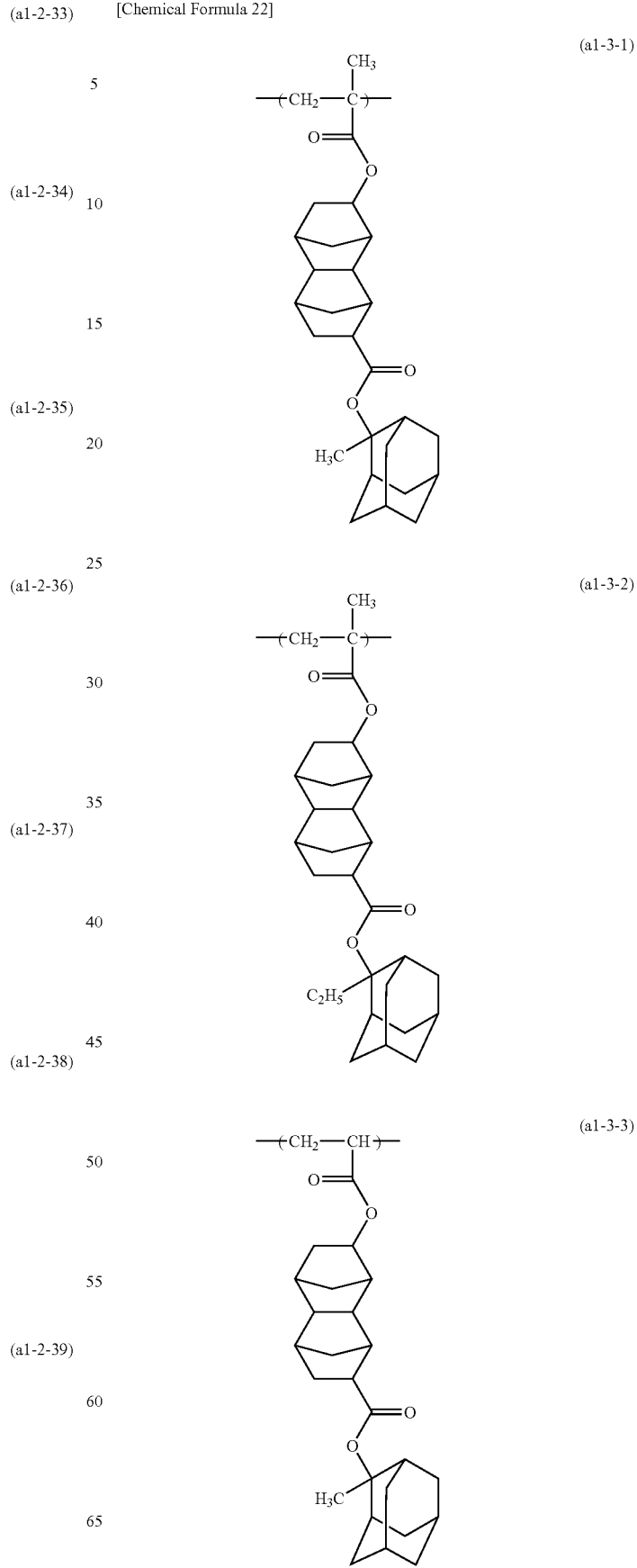

-continued
(a1-3-4)
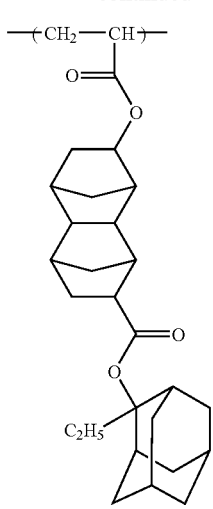
(a1-3-5)
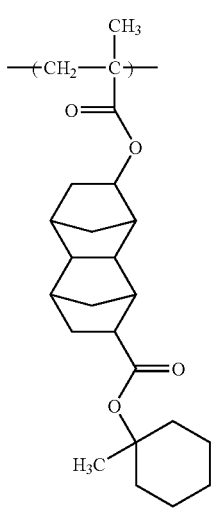
(a1-3-6)
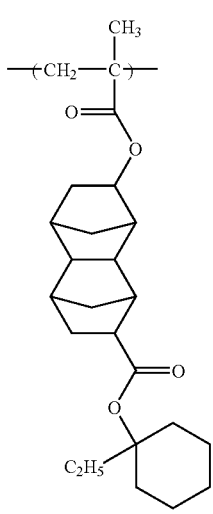
-continued
(a1-3-7)
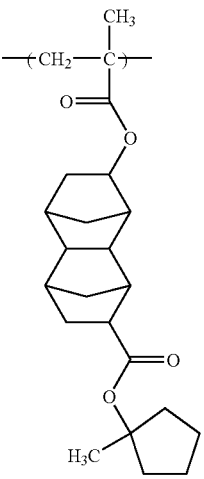
(a1-3-8)
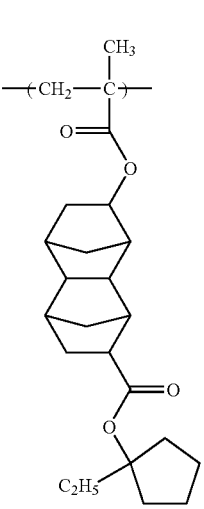
(a1-3-9)
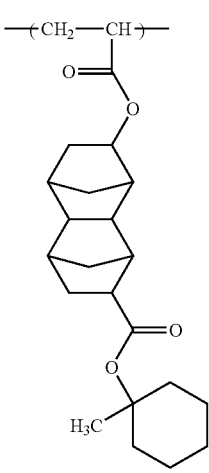

(a1-3-10) 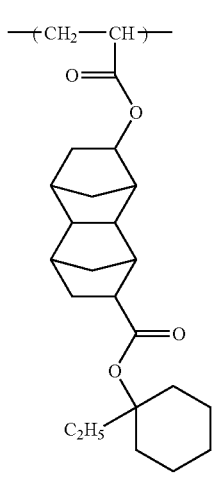
(a1-3-11) 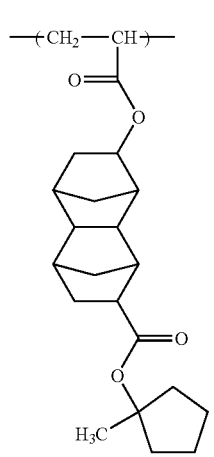
(a1-3-12) 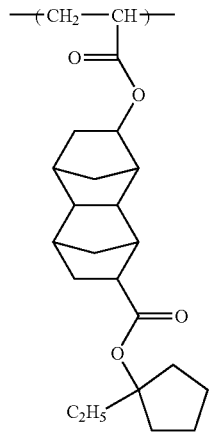
[Chemical Formula 23]
(a1-3-13) 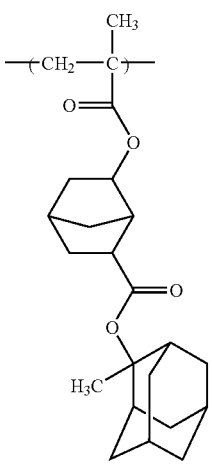
(a1-3-14) 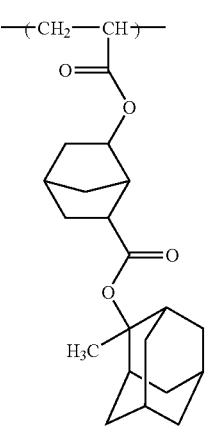
(a1-3-15)

(a1-3-16) 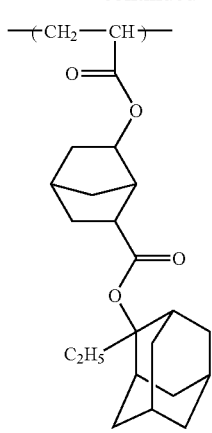
(a1-3-17) 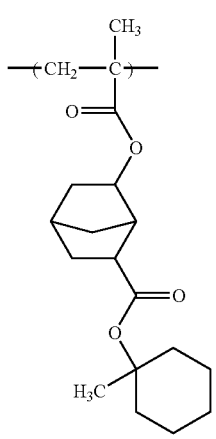
(a1-3-18) 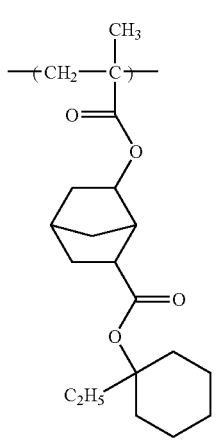
(a1-3-19) 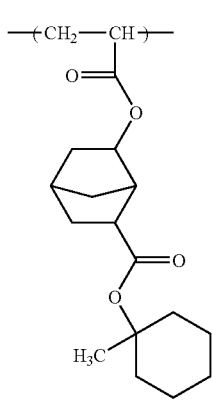
(a1-3-20) 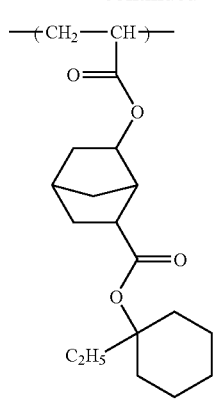
(a1-3-21) 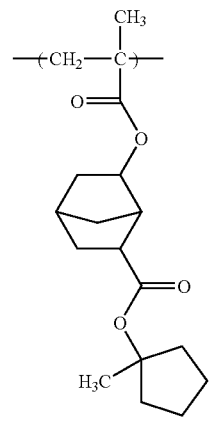
(a1-3-22) 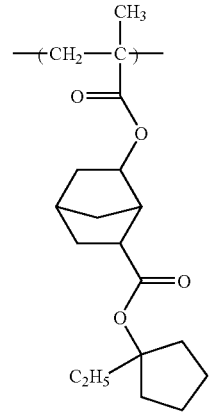
(a1-3-23) 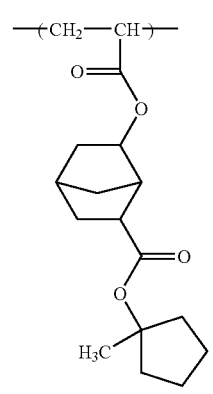

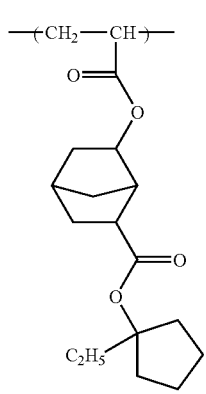
(a1-3-24)
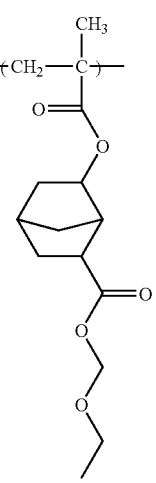
(a1-4-3)
[Chemical Formula 24]
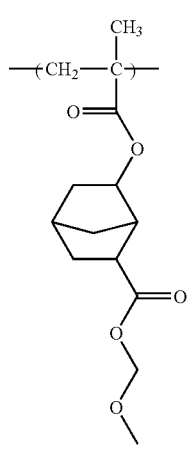
(a1-4-1)
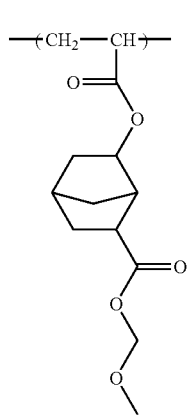
(a1-4-2)
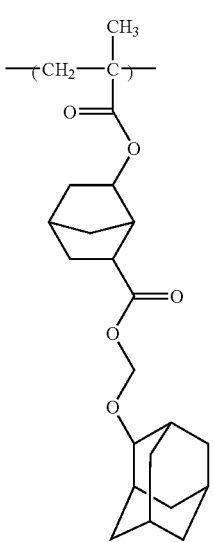
(a1-4-4)
(a1-4-5)

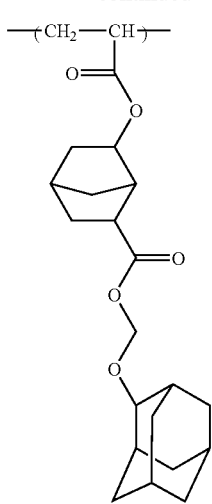
(a1-4-6)
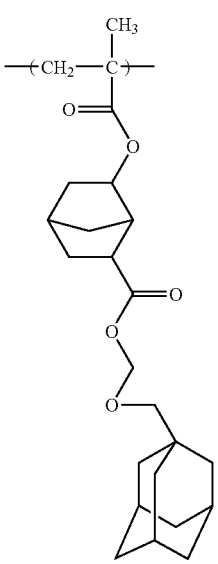
(a1-4-7)
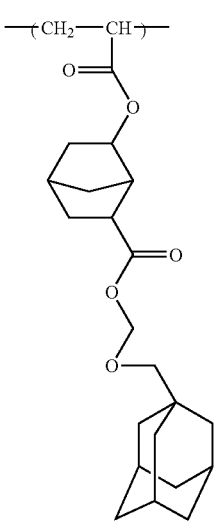
(a1-4-8)
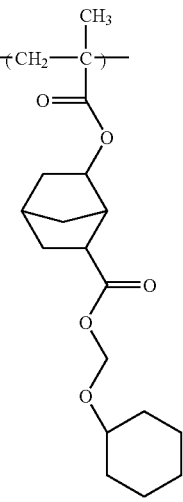
(a1-4-9)
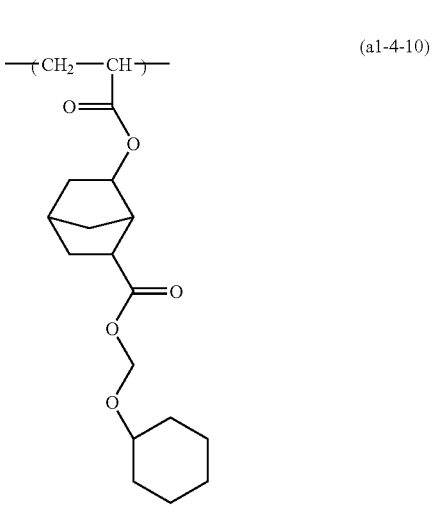
(a1-4-10)
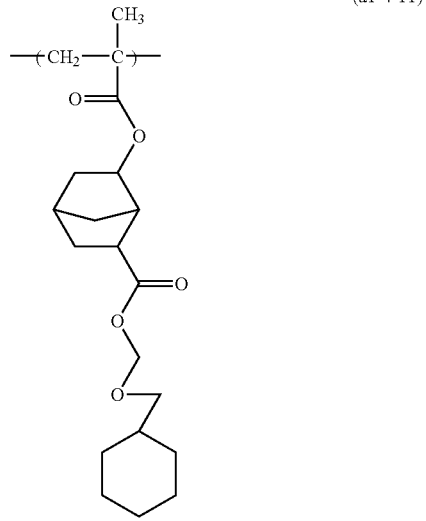
(a1-4-11)

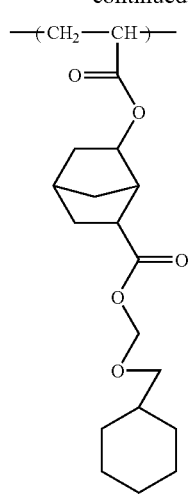
(a1-4-12)
(a1-4-13)
(a1-4-14)
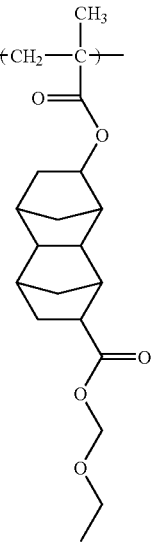
(a1-4-15)
[Chemical Formula 25]
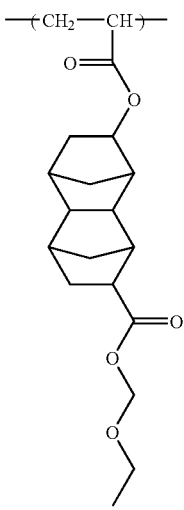
(a1-4-16)
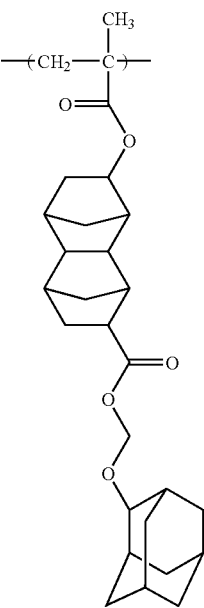
(a1-4-17)

-continued
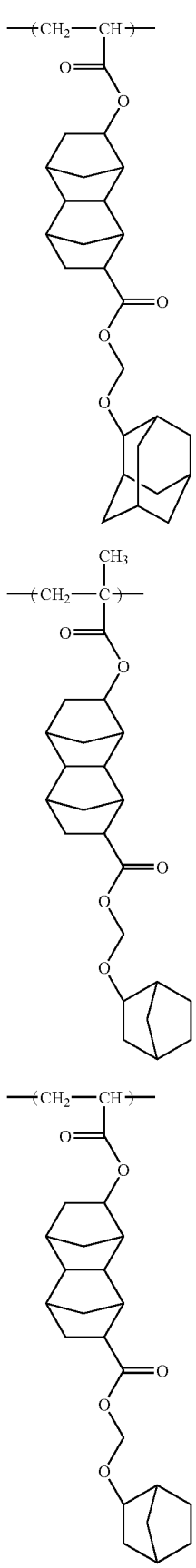
(a1-4-18)
(a1-4-19)
(a1-4-20)
-continued
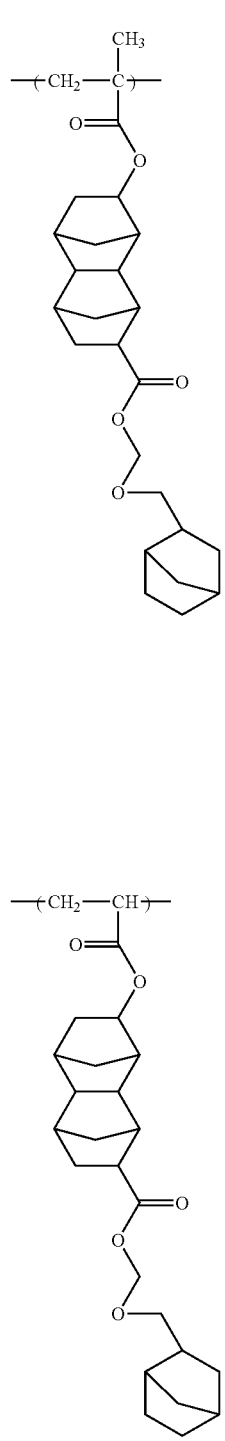
(a1-4-21)
(a1-4-22)

(a1-4-23)
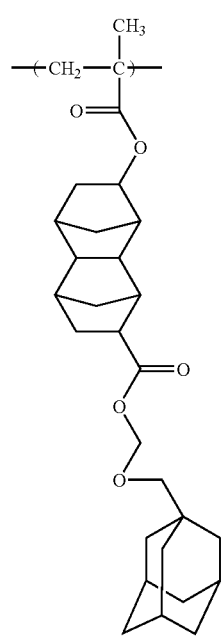
(a1-4-24)
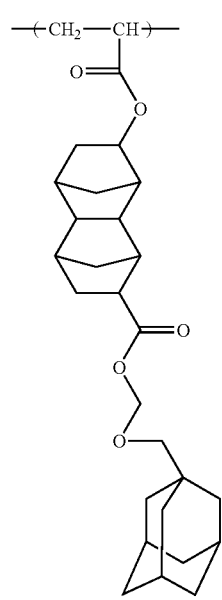
(a1-4-25)
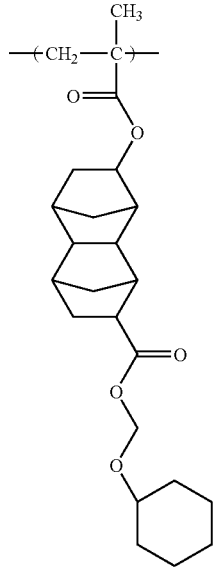
(a1-4-26)
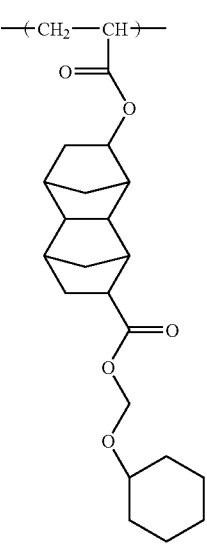
(a1-4-27)
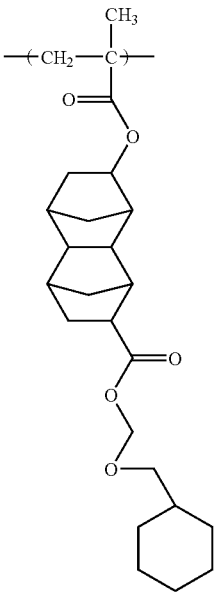

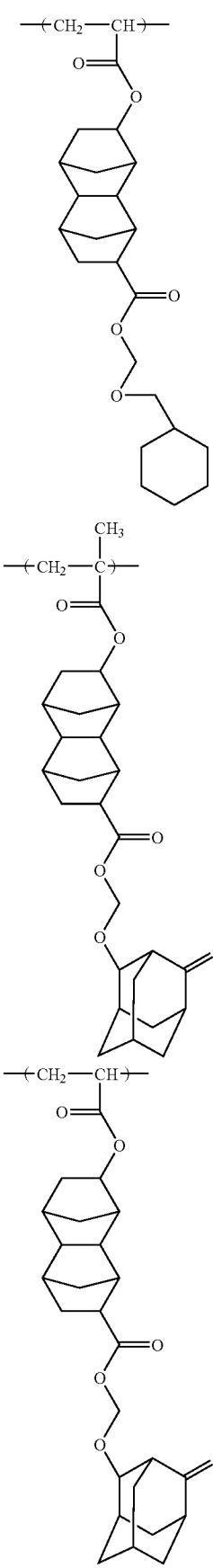

(a1-4-28)

(a1-4-29)

(a1-4-30)

In the polymer compound (A1), as the structural unit (a1), either a single type of structural unit may be used, or two or more types may be used in combination.

Of the above, structural units represented by general formula (a1-1) are preferable. More specifically, the use of at least one structural unit selected from the group consisting of structural units represented by formulas (a1-1-1) to (a-1-1-6) and formulas (a1-1-35) to (a1-1-41) is particularly desirable.

Further, as the structural unit (a1), structural units represented by general formula (a1-1-01) shown below, which includes the structural units represented by formulas (a1-1-1) to (a1-1-4), and structural units represented by general formula (a1-1-02) shown below, which includes the structural units represented by formulas (a1-1-35) to (a1-1-41) are also preferred.

[Chemical Formula 26]

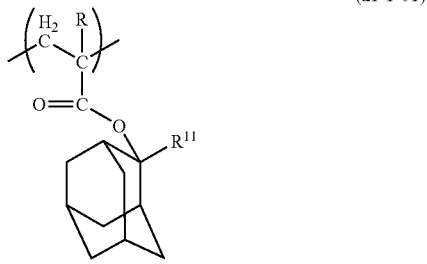

(a1-1-01)

wherein, R represents a hydrogen atom, a lower alkyl group or a halogenated lower alkyl group, and $R^{11}$ represents a lower alkyl group.

[Chemical Formula 27]

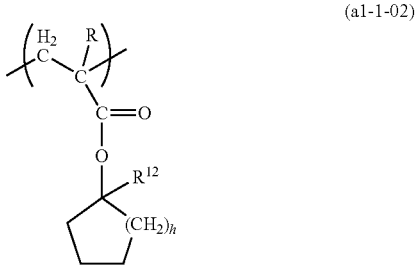

(a1-1-02)

wherein R represents a hydrogen atom, a lower alkyl group or a halogenated lower alkyl group, $R^{12}$ represents a lower alkyl group, and h represents an integer of 1 to 3.

In general formula (a1-1-01), R is as defined above. The lower alkyl group represented by $R^{11}$ is as defined for the lower alkyl group for R, and is preferably a methyl group or an ethyl group.

In general formula (a1-1-02), R is as defined above. The lower alkyl group represented by $R^{12}$ is as defined for the lower alkyl group for R, is preferably a methyl group or an ethyl group, and is most preferably an ethyl group. h is preferably 1 or 2, and is most preferably 2.

As the structural unit (a1), either a single type of structural unit may be used, or two or more types may be used in combination.

In those cases where the polymer compound (A1) includes the structural unit (a1), the proportion of the structural unit (a1) within the polymer compound (A1), relative to the total of all the structural units that constitute the polymer compound (A1), is preferably within a range from 5 to 70 mol %, more preferably from 20 to 70 mol %, and still more preferably from 25 to 55 mol %. By making this proportion at least as large as the lower limit of the above-mentioned range, a pattern can be formed easily using a resist composition prepared from the polymer compound (A1), whereas by making the proportion not more than the upper limit of the above-mentioned range, a good balance can be achieved with the other structural units.

[Structural Unit (a2)]

The structural unit (a2) is a structural unit derived from an acrylate ester that contains a lactone-containing cyclic group.

Here, the term "lactone-containing cyclic group" refers to a cyclic group including one ring containing a —O—C(O)— structure (a lactone ring). The lactone ring is counted as the first ring, and a group in which the only ring structure is the lactone ring is referred to as a monocyclic group, whereas a group containing another additional ring structure is described as a polycyclic group regardless of the structure of the other ring.

When the polymer compound (A1) is used for forming a resist film, the lactone-containing cyclic group of the structural unit (a2) is effective in improving the adhesion between the resist film and the substrate, and increasing the compatibility with developing solutions containing water.

As the structural unit (a2), there are no particular limitations, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

Specific examples of the structural unit (a2) include structural units represented by general formulas (a2-1) to (a2-5) shown below.

[Chemical Formula 28]

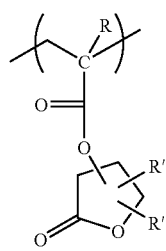
(a2-1)

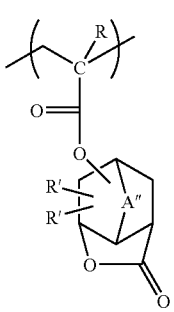
(a2-2)

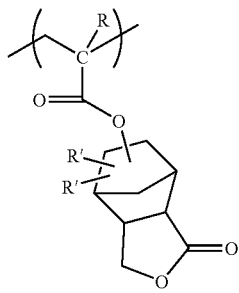
(a2-3)

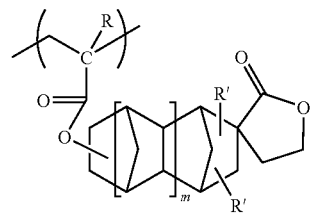
(a2-4)

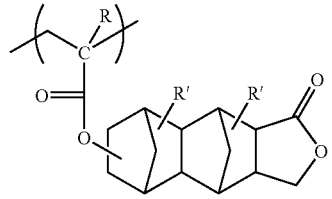
(a2-5)

wherein R represents a hydrogen atom, a lower alkyl group or a halogenated lower alkyl group, R' represents a hydrogen atom, a lower alkyl group, or an alkoxy group of 1 to 5 carbon atoms, m represents an integer of either 0 or 1, and A" represents an alkylene group of 1 to 5 carbon atoms or an oxygen atom.

The group R in general formulas (a2-1) to (a2-5) is as defined above for R in the structural unit (a1), and the same specific examples may be exemplified.

The lower alkyl group represented by R' is as defined above for the lower alkyl group represented by R in the structural unit (a1), and the same specific examples may be exemplified.

Specific examples of the alkylene group of 1 to 5 carbon atoms represented by A" include a methylene group, ethylene group, n-propylene group and isopropylene group.

In general formulas (a2-1) to (a2-5), considering factors such as industrial availability, R' is most preferably a hydrogen atom.

Specific examples of structural units of general formulas (a2-1) to (a2-5) are shown below.

[Chemical Formula 29]

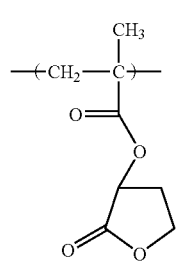
(a2-1-1)

-continued
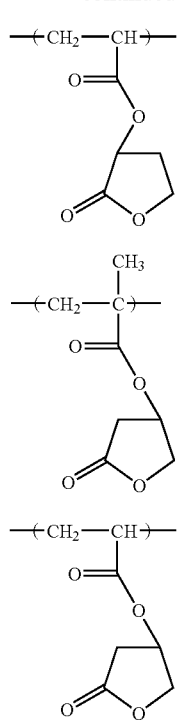
(a2-1-2)
(a2-1-3)
(a2-1-4)
(a2-1-5)
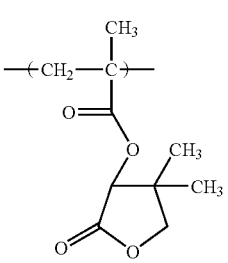
(a2-1-6)
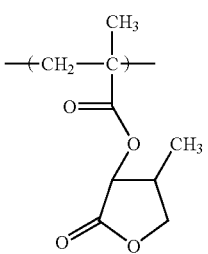
[Chemical Formula 30]
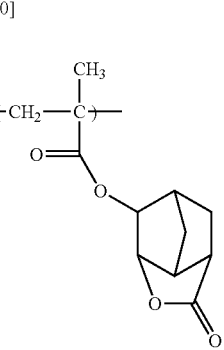
(a2-2-1)
-continued
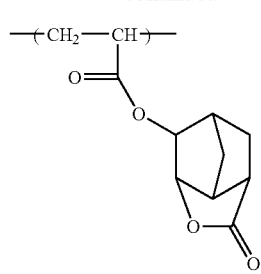
(a2-2-2)
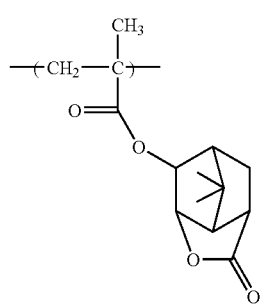
(a2-2-3)
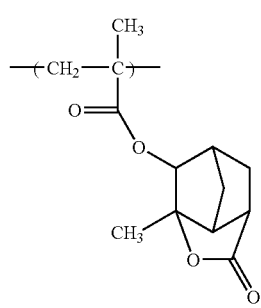
(a2-2-4)
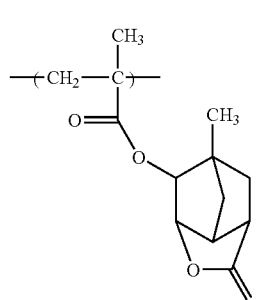
(a2-2-5)
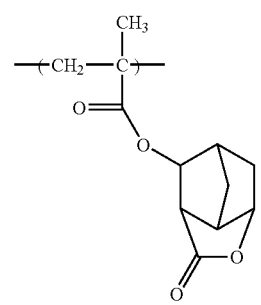
(a2-2-6)

[Chemical Formula 31]

(a2-3-9)
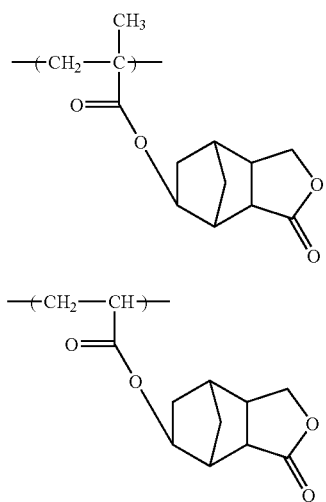
(a2-4-5)
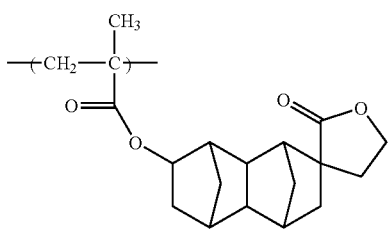
(a2-3-10)
(a2-4-6)
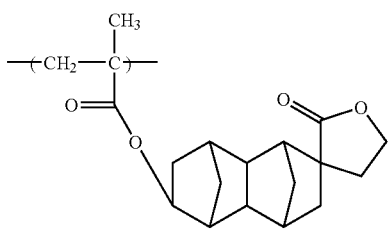
[Chemical Formula 32]
(a2-4-1)
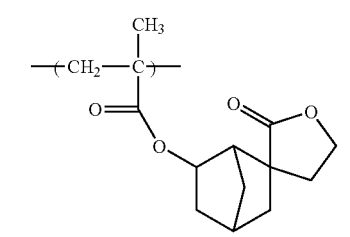
(a2-4-7)
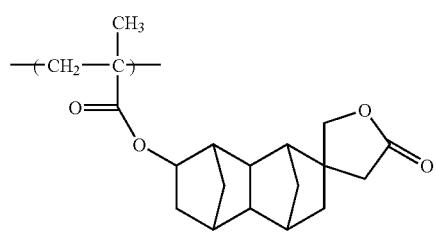
(a2-4-2)
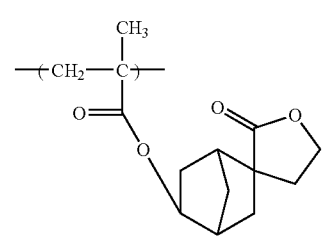
(a2-4-8)
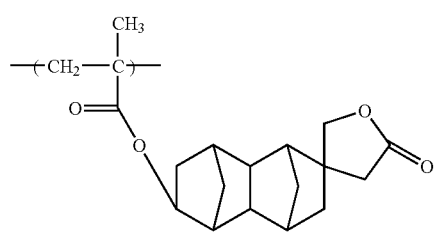
(a2-4-9)
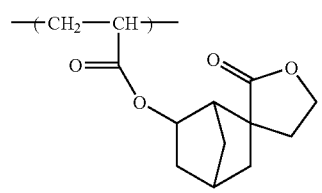
(a2-4-3)
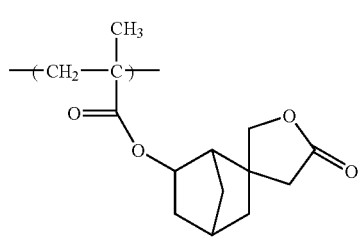
(a2-4-10)
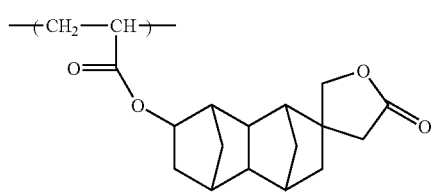
(a2-4-4)
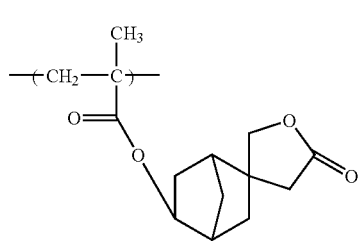
(a2-4-11)
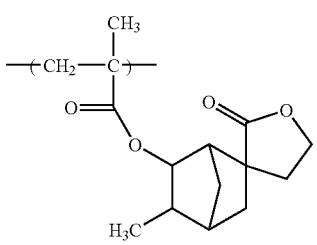

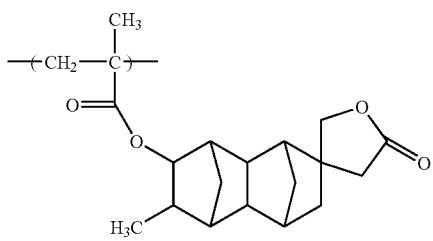
(a2-4-12)

[Chemical Formula 33]

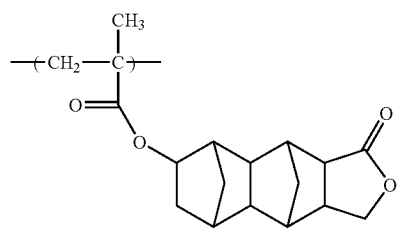
(a2-5-1)

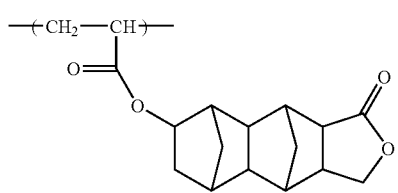
(a2-5-2)

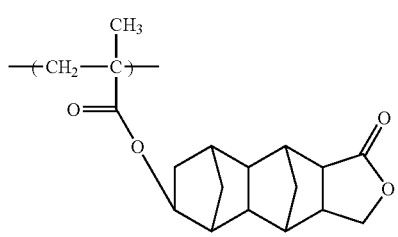
(a2-5-3)

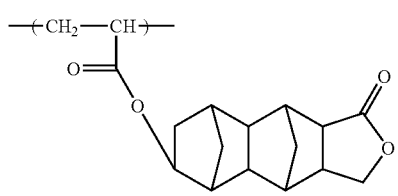
(a2-5-4)

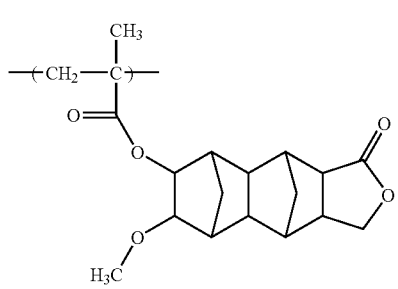
(a2-5-5)

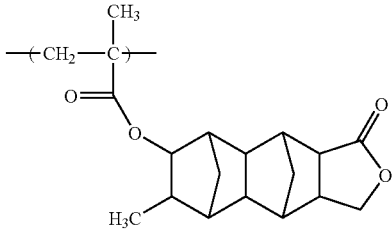
(a2-5-6)

Of these units, at least one structural unit selected from the group consisting of structural units represented by general formulas (a2-1) to (a2-5) is preferable, and at least one structural unit selected from the group consisting of structural units represented by general formulas (a2-1) to (a2-3) is more preferable. Specifically, it is preferable to use at least one structural unit selected from the group consisting of structural units represented by chemical formulas (a2-1-1), (a2-1-2), (a2-2-1), (a2-2-2), (a2-3-1), (a2-3-2), (a2-3-9) and (a2-3-10).

As the structural unit (a2), either a single type of structural unit may be used, or two or more types may be used in combination.

In those cases where the polymer compound (A1) includes the structural unit (a2), the proportion of the structural unit (a2) within the polymer compound (A1), relative to the total of all the structural units that constitute the polymer compound (A1), is preferably within a range from 1 to 60 mol %, more preferably from 10 to 55 mol %, and still more preferably from 20 to 55 mol %. By making this proportion at least as large as the lower limit of the above-mentioned range, the effect of including the structural unit (a2) can be satisfactorily achieved, whereas by making the proportion not more than the upper limit of the above-mentioned range, a good balance can be achieved with the other structural units.

[Structural Unit (a3)]

The structural unit (a3) is a structural unit that is outside the definition of the structural unit (a0), and is derived from an acrylate ester that contains a polar group-containing aliphatic hydrocarbon group.

By including the structural unit (a3), the hydrophilicity of the polymer compound (A1) is improved, and hence, the compatibility of the polymer compound (A1) with the developing solution (alkali aqueous solution) is improved in those cases where a positive resist pattern is formed using the polymer compound (A1) as the component (A) of the positive resist composition, resulting in improved solubility of the exposed portions in the alkali developing solution, which contributes to a favorable improvement in the resolution. Furthermore, in those cases where a negative resist pattern is formed using the polymer compound (A1) as the component (A) of the negative resist composition, then as described below in relation to structural units (a'3) and (a"3), including the structural unit (a3) contributes to improvements in the cross-linking reactivity and the residual film properties.

Examples of the polar group include a hydroxyl group, hydroxyalkyl group, cyano group, carboxyl group and a fluorinated hydroxyalkyl group (a hydroxyalkyl group in which some of the hydrogen atoms bonded to carbon atoms have been substituted with fluorine atoms), although a hydroxyl group or hydroxyalkyl group is preferred.

As the structural unit (a3), preferred units include the structural units (a'3) and (a"3) described below.

The structural unit (a'3) is a structural unit derived from an acrylate ester that contains a hydroxyl group-containing aliphatic cyclic group. In those cases where the resist composition is a negative composition, the polymer compound (A1) preferably includes the structural unit (a'3), because the hydroxyl group (the alcoholic hydroxyl group) within the structural unit (a'3) reacts with the component (C) under the action of the acid generated from the component (B), facilitating the conversion of the component (A) from a state that is soluble in an alkali developing solution to a state that is insoluble.

The "hydroxyl group-containing aliphatic cyclic group" is a group having a hydroxyl group bonded to an aliphatic cyclic group. The hydroxyl group may be bonded directly to the aliphatic cyclic group, or may be bonded indirectly in the form of a hydroxyalkyloxy group.

The alkyl group in the hydroxyalkyloxy group is preferably a linear or branched group. Although there are no particular limitations on the number of carbon atoms in the alkyl group, the number of carbon atoms is preferably within a range from 2 to 5, more preferably from 2 to 4, and is most preferably either 2 or 3.

There are no particular limitations on the number of hydroxyl groups within the hydroxyalkyloxy group, although the number of hydroxyl groups is preferably within a range from 1 to 4, more preferably from 1 to 3, and is most preferably either 1 or 2. The hydroxyl group is preferably a primary hydroxyl group or secondary hydroxyl group, and a primary hydroxyl group is particularly desirable.

As the hydroxyalkyloxy group, monohydroxyalkyloxy groups and dihydroxyalkyloxy groups are preferred, and a monohydroxyethyloxy group, monohydroxypropyloxy group and dihydroxypropyloxy group are particularly preferred.

The number of hydroxyl groups bonded to the aliphatic cyclic group is preferably within a range from 1 to 3, and is most preferably 1.

The aliphatic cyclic group may or may not have a substituent. Examples of the substituent include lower alkyl groups of 1 to 5 carbon atoms, a fluorine atom, fluorinated lower alkyl groups of 1 to 5 carbon atoms, and an oxygen atom (=O).

The aliphatic cyclic group includes both hydrocarbon groups formed solely from carbon and hydrogen (namely, alicyclic groups), and heterocyclic groups in which a portion of the carbon atoms that constitute the ring structure of an alicyclic group have been substituted with a hetero atom such as an oxygen atom, nitrogen atom or sulfur atom. As the aliphatic cyclic group, an alicyclic group is preferred.

The aliphatic cyclic group may be either saturated or unsaturated, but in terms of achieving superior transparency to ArF excimer lasers and the like, and also achieving excellent resolution and depth of focus (DOF) and the like, a saturated group is preferred.

The aliphatic cyclic group may be either a monocyclic group or a polycyclic group, but is preferably a polycyclic group.

Furthermore, the number of carbon atoms within the aliphatic cyclic group is preferably within a range from 5 to 15.

Specific examples of the aliphatic cyclic group (prior to bonding of the hydroxyl group) include the groups described below.

Namely, examples of monocyclic groups include groups in which two or more hydrogen atoms have been removed from a cycloalkane. Specific examples include groups in which two or more hydrogen atoms have been removed from cyclopentane or cyclohexane, and groups in which two hydrogen atoms have been removed from cyclohexane are particularly desirable.

Examples of polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

Of these, groups in which two hydrogen atoms have been removed from cyclohexane, adamantane, norbornane or tetracyclododecane are readily available industrially, and are therefore preferred. Of these groups, groups in which two hydrogen atoms have been removed from adamantane or norbornane are particularly preferred.

In the structural unit (a'3), the hydroxyl group-containing aliphatic cyclic group is preferably bonded to the oxygen atom at the terminal of the carbonyloxy group [—C(O)—O—] of the acrylate ester.

Specific examples of the structural unit (a'3) include the structural units represented by general formula (a'3-1) shown below.

[Chemical Formula 34]

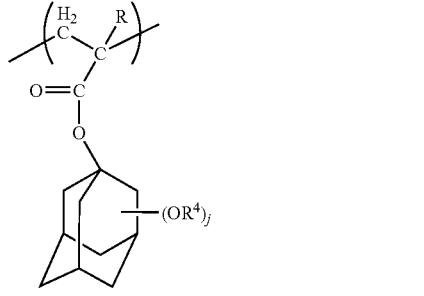

(a'3-1)

wherein R is as defined above, $R^4$ represents a hydrogen atom or a hydroxyalkyl group, and j represents an integer of 1 to 3.

In the general formula (a'3-1), R is as defined above for R in general formula (a1-0-1).

$R^4$ represents a hydrogen atom or a hydroxyalkyl group.

The alkyl group within the hydroxyalkyl group for $R^4$ is preferably a linear or branched group. Although there are no particular limitations on the number of carbon atoms in the alkyl group, the number of carbon atoms is preferably within a range from 2 to 5, more preferably from 2 to 4, and is most preferably either 2 or 3.

There are no particular limitations on the number of hydroxyl groups within the hydroxyalkyl group for $R^4$, although the number of hydroxyl groups is preferably within a range from 1 to 4, more preferably from 1 to 3, and is most preferably either 1 or 2. The hydroxyl group is preferably a primary hydroxyl group or secondary hydroxyl group, and a primary hydroxyl group is particularly desirable.

In the present invention, $R^4$ is preferably a monohydroxyalkyl group, dihydroxyalkyl group or a hydrogen atom, and a monohydroxyethyl group, monohydroxypropyl group, dihydroxypropyl group or hydrogen atom is particularly preferred.

j is an integer of 1 to 3, is preferably 1 or 2, and is most preferably 1. When j is 2, it is preferable that the $OR^4$ groups are bonded to the 3rd and 5th positions of the adamantyl group. When j is 1, it is preferable that the $OR^4$ group is bonded to the 3rd position of the adamantyl group.

j is preferably 1, and it is particularly desirable that the $OR^4$ group is bonded to the 3rd position of the adamantyl group. In other words, as the structural unit (a'3), structural units represented by general formula (a'3-11) shown below are preferred.

[Chemical Formula 35]

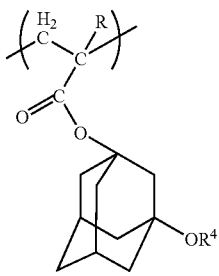

(a'3-11)

The structural unit (a"3) is a structural unit derived from an acrylic acid having no cyclic structures and having an alcoholic hydroxyl group on a side chain. In those cases where the resist composition is a negative composition, if the polymer compound (A1) includes the structural unit (a'3), then the hydroxyl group (the alcoholic hydroxyl group) within the structural unit (a"3) reacts with the component (C) under the action of the acid generated from the component (B). This facilitates the conversion of the component (A) from a state that is soluble in an alkali developing solution to a state that is insoluble, yields an improvement in the resolution, is able to suppress thickness loss, improves the controllability of the cross-linking reaction during pattern formation, tends to improve the film density that leads to an improvement in the heat resistance, and also yields an improvement in the etching resistance.

The expression "having no cyclic structures" means that the structural unit includes no aliphatic cyclic groups or aromatic groups. The structural unit (a"3) is readily distinguishable from the structural unit (a'3) as a result of having no cyclic structure.

Examples of structural units having an alcoholic hydroxyl group on a side chain include structural units having a hydroxyalkyl group.

In this hydroxyalkyl group, the alkyl group is preferably a linear or branched group. Although there are no particular limitations on the number of carbon atoms in the alkyl group, the number of carbon atoms is preferably within a range from 1 to 20, more preferably from 1 to 16, and most preferably from 1 to 12. There are no particular limitations on the number of hydroxyl groups, although the number of hydroxyl groups is preferably either 1 or 2, and is most preferably 1.

The hydroxyalkyl group may, for example, be bonded directly to the α-position carbon atom of the main chain (the portion formed by cleavage of the ethylenic double bond of the acrylic acid), or may form an ester through substitution of the hydrogen atom of the acrylic acid carboxyl group. In the structural unit (a"3), the hydroxyalkyl group preferably exists at either one, or both of these locations.

In those cases where the hydroxyalkyl group is not bonded to the α-position, the hydrogen atom at the α-position carbon atom may be replaced with an alkyl group or a halogenated alkyl group. These groups are preferably the same as those exemplified above in the description for R within general formula (a1-0-1).

As the structural unit (a"3), structural units represented by general formula (a"3-1) shown below are preferred.

[Chemical formula 36]

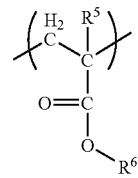

(a"3-1)

wherein, $R^5$ represents a hydrogen atom, an alkyl group, a halogenated alkyl group or a hydroxyalkyl group, and $R^6$ represents an alkyl group or a hydroxyalkyl group, provided that at least one of $R^5$ and $R^6$ represents a hydroxyalkyl group.

In general formula (a"3-1), $R^5$ represents a hydrogen atom, an alkyl group, a halogenated alkyl group or a hydroxyalkyl group.

The hydroxyalkyl group for $R^5$ is preferably a linear or branched hydroxyalkyl group of not more than 10 carbon atoms, and is more preferably a linear or branched hydroxyalkyl group of 1 to 8 carbon atoms. There are no particular limitations on the number of hydroxyl groups in the hydroxyalkyl group, although one hydroxyl group is typical. Furthermore, the hydroxyl group is preferably either a primary hydroxyl group or a secondary hydroxyl group, and a primary hydroxyl group is particularly desirable. The hydroxyalkyl group for $R^5$ is most preferably a hydroxymethyl group or a hydroxyethyl group.

The hydroxyalkyl group for $R^5$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or hydroxyethyl group. There are no particular limitations on the number of hydroxyl groups or the bonding positions of those groups, although one hydroxyl group is typical, and although the hydroxyl group may be a tertiary hydroxyl group, a group that includes a secondary hydroxyl group is more preferable, and a group containing a primary hydroxyl group bonded to the terminal of an alkyl group is the most desirable.

The alkyl group for $R^5$ is preferably an alkyl group of not more than 10 carbon atoms, even more preferably an alkyl group of 1 to 8 carbon atoms, and is most preferably an ethyl group or methyl group.

The halogenated lower alkyl group for $R^5$ is preferably a lower alkyl group of not more than 5 carbon atoms (most preferably an ethyl group or methyl group) in which some or all of the hydrogen atoms have been substituted with halogen atoms (and preferably fluorine atoms).

$R^6$ represents an alkyl group or a hydroxyalkyl group.
The alkyl group for $R^6$ is as described above for the alkyl group for $R^5$.

The hydroxyalkyl group for $R^6$ is preferably a linear or branched hydroxyalkyl group of not more than 10 carbon atoms, is more preferably a linear or branched hydroxyalkyl group of 2 to 8 carbon atoms, and is most preferably a hydroxyethyl group. There are no particular limitations on the number of hydroxyl groups in the hydroxyalkyl group, although one hydroxyl group is typical. Furthermore, the hydroxyl group is preferably a primary or secondary hydroxyl group, and a primary hydroxyl group is particularly desirable.

In general formula (a"3-1), at least one of $R^5$ and $R^6$ represents a hydroxyalkyl group.

Of these structural units of formula (a"3-1), from the viewpoint of improving the film density, units in which $R^5$ is a hydroxyalkyl group and $R^6$ is an alkyl group are preferred, and of these, structural units derived from ethyl α-(hydroxymethyl)acrylate or methyl α-(hydroxymethyl)acrylate are particularly desirable.

Furthermore, from the viewpoint of cross-linking efficiency, structural units of formula (a"3-1) in which $R^5$ is an alkyl group and $R^6$ is a hydroxyalkyl group are preferred. Of these units, structural units derived from hydroxyethyl (meth) acrylate esters are particularly desirable.

Other preferred forms for the structural unit (a3) besides the structural units (a'3) and (a"3) described above include structural units represented by formula (a3-2) shown below and structural units represented by formula (a3-3) shown below.

[Chemical Formula 37]

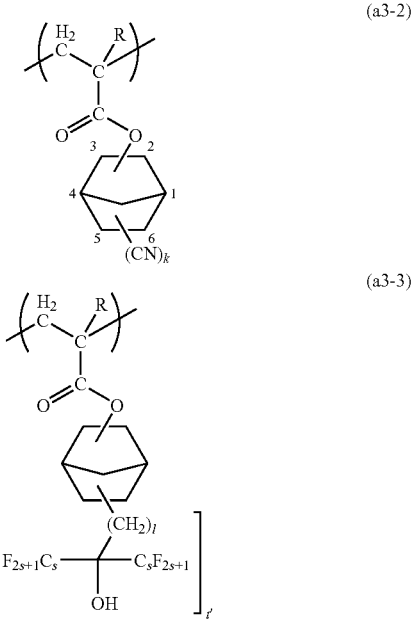

wherein R is as defined above, k is an integer of 1 to 3, t' is an integer of 1 to 3, l is an integer of 1 to 5, and s is an integer of 1 to 3.

In formula (a3-2), k is preferably 1. The cyano group is preferably bonded to the 5th or 6th position of the norbornyl group.

In formula (a3-3), t' is preferably 1, l is preferably 1 and s is preferably 1. Further, in formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

In the polymer compound (A1), as the structural unit (a3), one type of structural unit may be used, or two or more types may be used in combination.

In the present invention, as the structural unit (a3), the use of a structural unit derived from an acrylate ester containing a hydroxyl group, such as the structural units (a'3) and (a"3) described above, is particularly desirable.

In those cases where the resist composition of the present invention is a positive resist composition and the polymer compound (A1) includes the structural unit (a3), the proportion of the structural unit (a3) within the polymer compound (A1), relative to the total of all the structural units that constitute the polymer compound (A1), is preferably within a range from 5 to 50 mol %, more preferably from 5 to 40 mol %, and still more preferably from 5 to 25 mol %.

Furthermore, in those cases where the resist composition of the present invention is a positive resist composition and the polymer compound (A1) includes the structural unit (a3), the structural unit (a3) preferably includes the structural unit (a'3), more preferably includes a structural unit of general formula (a'3-1) in which $R^4$ is a hydrogen atom, and still more preferably includes a structural unit of general formula (a'3-11) in which $R^4$ is a hydrogen atom.

In those cases where the resist composition of the present invention is a negative resist composition and the polymer compound (A1) includes the structural unit (a3), the proportion of the structural unit (a3) within the polymer compound (A1), relative to the total of all the structural units that constitute the polymer compound (A1), is preferably within a range from 5 to 80 mol %, more preferably from 10 to 70 mol %, and still more preferably from 25 to 65 mol %.

Furthermore, in those cases where the resist composition of the present invention is a negative resist composition and the polymer compound (A1) includes the structural unit (a3), the structural unit (a3) preferably includes the structural unit (a'3) and/or the structural unit (a"3).

In such cases, the polymer compound (A1) may include only one of the structural unit (a'3) and the structural unit (a"3), or may include both structural units.

Furthermore, for the structural unit (a'3) and the structural unit (a"3), in each case, either a single type of structural unit may be used, or two or more types may be used in combination.

In such cases, the proportion of the structural unit (a'3) within the polymer compound (A1), relative to the total of all the structural units that constitute the polymer compound (A1), is preferably within a range from 5 to 80 mol %, more preferably from 10 to 70 mol %, and still more preferably from 20 to 65 mol %. By making this proportion at least as large as the lower limit of the above-mentioned range, the effect of including the structural unit (a'3) can be satisfactorily achieved, whereas by making the proportion not more than the upper limit of the above-mentioned range, a good balance can be achieved with the other structural units.

Furthermore, the proportion of the structural unit (a"3) within the polymer compound (A1), relative to the total of all the structural units that constitute the polymer compound (A1), is preferably within a range from 5 to 50 mol %, more preferably from 5 to 40 mol %, still more preferably from 5 to 30 mol %, and most preferably from 10 to 25 mol %. By making this proportion at least as large as the lower limit of the above-mentioned range, the effect of including the structural unit (a"3) can be satisfactorily achieved, whereas by making the proportion not more than the upper limit of the above-mentioned range, a good balance can be achieved with the other structural units.

[Structural Unit (a4)]

The structural unit (a4) is a structural unit derived from a non-acid-dissociable cyclic alkyl acrylate ester. Here, the expression "non-acid-dissociable" means that even if the acid generated from the component (B) acts upon the structural unit, the cyclic alkyl group does not dissociate from the structural unit.

Examples of the cyclic alkyl group within the structural unit (a4) include the same aliphatic cyclic groups as those exemplified above in connection with the aforementioned structural unit (a0), and any of the multitude of conventional cyclic alkyl groups used within the resin component of resist compositions for ArF excimer lasers or KrF excimer lasers (and particularly for ArF excimer lasers) can be used.

The cyclic alkyl group is preferably contains from 3 to 12 carbon atoms, and more preferably from 6 to 12 carbon atoms, and in consideration of industrial availability and the like, at least one alicyclic alkyl group selected from amongst a tricyclodecanyl group, adamantyl group, tetracyclododecanyl group, isobornyl group and norbornyl group is particularly desirable.

These cyclic alkyl groups may be substituted with a linear or branched alkyl group of 1 to 5 carbon atoms.

Specific examples of the structural unit (a4) include units with structures represented by general formulas (a4-1) to (a4-5) shown below. Of these, the structure of (a4-2) is preferred.

[Chemical Formula 38]

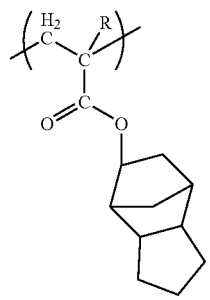
(a4-1)

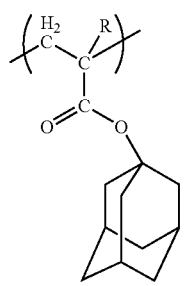
(a4-2)

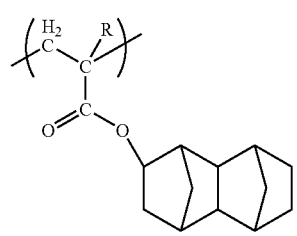
(a4-3)

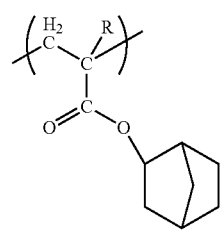
(a4-4)

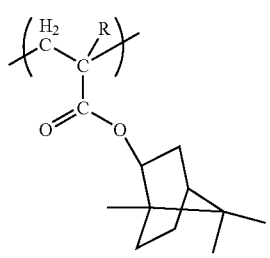
(a4-5)

wherein R is as defined above.

In the polymer compound (A1), as the structural unit (a4), either a single type of structural unit may be used, or two or more types may be used in combination.

When the structural unit (a4) is included in the polymer compound (A1), the amount of the structural unit (a4) within the polymer compound (A1), relative to the total of all the structural units that constitute the polymer compound (A1), is preferably within a range from 1 to 60 mol %, more preferably from 5 to 55 mol %, and still more preferably from 10 to 50 mol %.

[Other Structural Units]

The polymer compound (A1) may also include other structural units (a5) besides the aforementioned structural units (a0) to (a4), provided the inclusion of these other units does not impair the effects of the present invention.

As the structural unit (a5), any other structural unit that cannot be classified as one of the above structural units (a0) through (a4) can be used without any particular restrictions, and these other structural units may be selected from the multitude of conventional structural units used within resist resins for ArF excimer lasers or KrF excimer lasers (and particularly for ArF excimer lasers).

In the polymer compound (A1), as the structural unit (a5), either a single type of structural unit may be used, or two or more types may be used in combination.

When the structural unit (a5) is included in the polymer compound (A1), the amount of the structural unit (a5) within the polymer compound (A1), relative to the total of all the structural units that constitute the polymer compound (A1), is preferably within a range from 1 to 30 mol %, and more preferably from 3 to 20 mol %.

In the present invention, the polymer compound (A1) is preferably either a polymer composed solely of the structural unit (a0), or a copolymer composed of the structural unit (a0) and at least one structural unit selected from the group consisting of the structural units (a1) to (a4). The copolymer may also include the structural unit (a5).

Examples of preferred copolymers for the polymer compound (A1) include the copolymers (A1-1) to (A1-6) shown below.

Copolymer (A1-1): a copolymer having at least two types of structural units, including the structural units (a0) and (a1).
Copolymer (A1-2): a copolymer having at least two types of structural units, including the structural units (a0) and (a2).
Copolymer (A1-3): a copolymer having at least two types of structural units, including the structural units (a0) and (a3).
Copolymer (A1-4): a copolymer having at least two types of structural units, including the structural units (a0) and (a4).
Copolymer (A1-5): a copolymer having at least three types of structural units, including the structural units (a0), (a1) and (a2).

Copolymer (A1-6): a copolymer having at least three types of structural units, including the structural unit (a0) and two types of the structural unit (a3).

The copolymer (A1-1) may also include a structural unit (a5) in addition to the structural units (a0) and (a1), but is preferably a binary copolymer composed solely of the structural units (a0) and (a1).

Preferred forms of the copolymer (A1-1) include copolymers having the two structural units shown below in general formula (A1-11), and copolymers formed solely from the two structural units shown in general formula (A1-11) are particularly desirable.

[Chemical Formula 39]

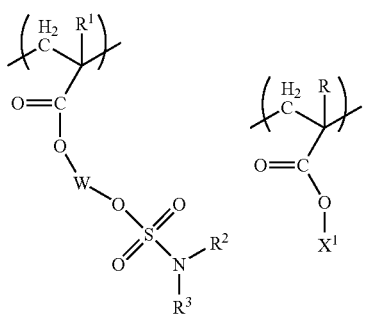

(A1-11)

wherein $R^1$, $R^2$, $R^3$ and W are as defined above for $R^1$, $R^2$, $R^3$ and W in formula (a0-1), and R and $X^1$ are as defined above for R and $X^1$ in formula (a1-0-1).

The copolymer (A1-2) may also include a structural unit (a5) in addition to the structural units (a0) and (a2), but is preferably a binary copolymer composed solely of the structural units (a0) and (a2).

Preferred forms of the copolymer (A1-2) include copolymers having the two structural units shown below in general formula (A1-12) and copolymers having the two structural units shown below in general formula (A1-13), and copolymers formed solely from the two structural units shown in general formula (A1-12) and copolymers formed solely from the two structural units shown in general formula (A1-13) are particularly desirable.

[Chemical Formula 40]

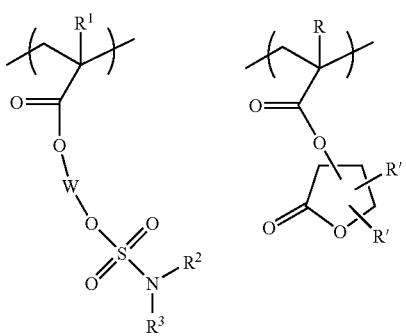

(A1-12)

wherein $R^1$, $R^2$, $R^3$ and W are as defined above for $R^1$, $R^2$, $R^3$ and W in formula (a0-1), and R and R' are as defined above for R and R' in formula (a2-1).

[Chemical Formula 41]

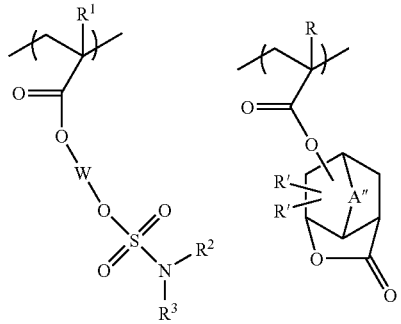

(A1-13)

wherein $R^1$, $R^2$, $R^3$ and W are as defined above for $R^1$, $R^2$, $R^3$ and W in formula (a0-1), and R, R' and A" are as defined above for R, R' and A" in formula (a2-2).

The copolymer (A1-3) may also include a structural unit (a5) in addition to the structural units (a0) and (a3), but is preferably a binary copolymer composed solely of the structural units (a0) and (a3).

Preferred forms of the copolymer (A1-3) include copolymers having the two structural units shown below in general formula (A1-14) and copolymers having the two structural units shown below in general formula (A1-15), and copolymers formed solely from the two structural units shown in general formula (A1-14) and copolymers formed solely from the two structural units shown in general formula (A1-15) are particularly desirable.

[Chemical Formula 42]

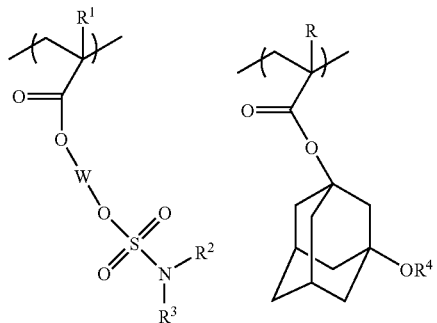

(A1-14)

wherein $R^1$, $R^2$, $R^3$ and W are as defined above for $R^1$, $R^2$, $R^3$ and W in formula (a0-1), and R and $R^4$ are as defined above for R and $R^4$ in general (a'3-11).

[Chemical Formula 43]

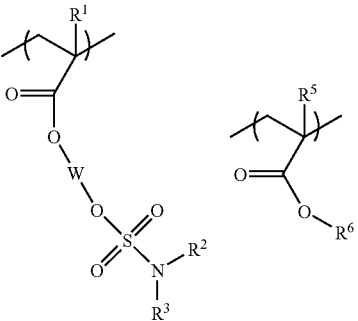

(A1-15)

wherein $R^1$, $R^2$, $R^3$ and W are as defined above for $R^1$, $R^2$, $R^3$ and W in formula (a0-1), and $R^5$ and $R^6$ are as defined above for $R^5$ and $R^6$ in formula (a''3-1).

The copolymer (A1-4) may also include a structural unit (a5) in addition to the structural units (a0) and (a4), but is preferably a binary copolymer composed solely of the structural units (a0) and (a4).

Preferred forms of the copolymer (A1-4) include copolymers having the two structural units shown below in general formulas (A1-16) or (A1-16'), and copolymers formed solely from the two structural units shown in general formula (A1-16) are particularly desirable.

[Chemical Formula 44]

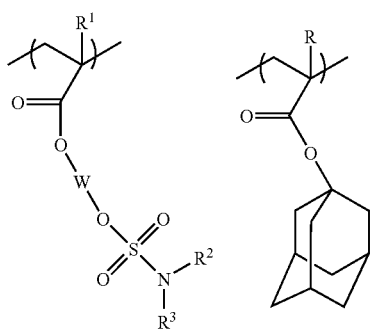

(A1-16)

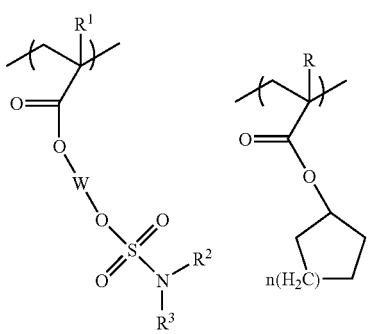

(A1-16')

wherein $R^1$, $R^2$, $R^3$ and W are as defined above for $R^1$, $R^2$, $R^3$ and W in formula (a0-1), R is as defined above for R in formula (a'3-11), and n represents an integer of 1 to 3.

The copolymer (A1-5) may also include a structural unit (a5) in addition to the structural units (a0), (a1) and (a2), but is preferably a ternary copolymer composed solely of the structural units (a0), (a1) and (a2).

Preferred forms of the copolymer (A1-5) include copolymers having the three structural units shown below in general formula (A1-17) and copolymers having the three structural units shown below in general formula (A1-18), and copolymers formed solely from the three structural units shown in general formula (A1-17) and copolymers formed solely from the three structural units shown in general formula (A1-18) are particularly desirable.

[Chemical Formula 45]

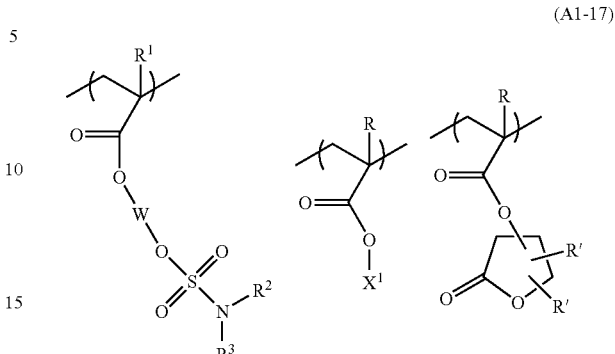

(A1-17)

wherein $R^1$, $R^2$, $R^3$ and W are as defined above for $R^1$, $R^2$, $R^3$ and W in formula (a0-1), R and $X^1$ are as defined above for R and $X^1$ in formula (a1-0-1), R and R' are as defined above for R and R' in formula (a2-1), and the plurality of R groups may be either the same or different.

[Chemical Formula 46]

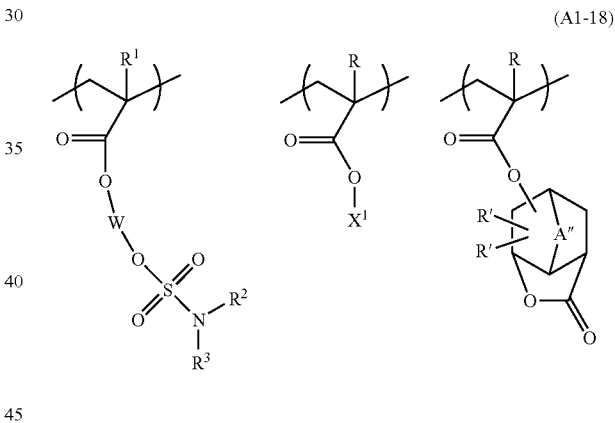

(A1-18)

wherein $R^1$, $R^2$, $R^3$ and W are as defined above for $R^1$, $R^2$, $R^3$ and W in formula (a0-1), R and $X^1$ are as defined above for R and $X^1$ in formula (a1-0-1), R and A'' are as defined above for R and A'' in formula (a2-2), and the plurality of R groups may be either the same or different.

The copolymer (A1-6) may also include a structural unit (a5) in addition to the structural unit (a0) and the two types of structural unit (a3), but is preferably a ternary copolymer composed solely of the structural units (a0) and the two types of structural unit (a3).

Preferred forms of the copolymer (A1-6) include copolymers having the three structural units shown below in general formula (A1-19) and copolymers having the three structural units shown below in general formula (A1-20), and copolymers formed solely from the three structural units shown in general formula (A1-19) and copolymers formed solely from the three structural units shown in general formula (A1-20) are particularly desirable.

[Chemical Formula 47]

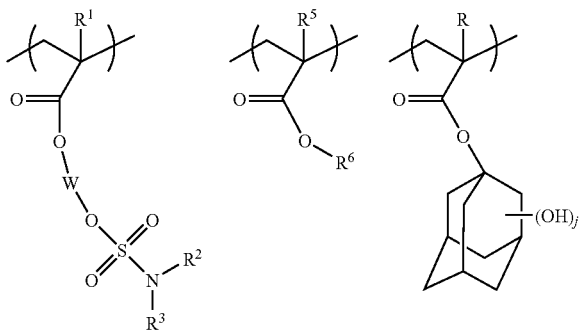

(A1-19)

wherein $R^1$, $R^2$, $R^3$ and W are as defined above for $R^1$, $R^2$, $R^3$ and W in formula (a0-1), $R^5$ and $R^6$ are as defined above for $R^5$ and $R^6$ in formula (a"3-1), and R and j are as defined above for R and j in formula (a'3-1).

[Chemical Formula 48]

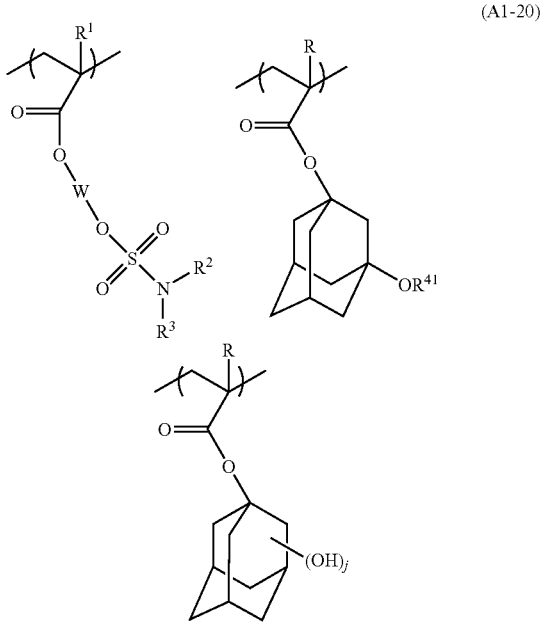

(A1-20)

wherein $R^1$, $R^2$, $R^3$ and W are as defined above for $R^1$, $R^2$, $R^3$ and W in formula (a0-1), R and j are as defined above for R and j in formula (a'3-1), $R^{41}$ is a hydroxyalkyl group, and the plurality of R groups may be either the same or different.

In formula (A1-20), examples of the hydroxyalkyl group for $R^{41}$ include the same hydroxyalkyl groups as those exemplified above for $R^4$ in formula (a'3-1).

In those cases where the resist composition of the present invention is a negative resist composition, the polymer compound (A1) is preferably a polymer formed solely from the structural unit (a0), a copolymer (A1-3), a copolymer (A1-4) or a copolymer (A1-6).

In these cases, within these polymers and copolymers, as the structural unit (a0), a unit in which at least one of $R^2$ and $R^3$ represents a hydrogen atom is preferred, and structural units in which $R^2$ and $R^3$ both represent hydrogen atoms are particularly desirable.

In those cases where the resist composition of the present invention is a positive resist composition, the polymer compound (A1) is preferably a polymer formed solely from the structural unit (a0), a copolymer (A1-1), a copolymer (A1-2) or a copolymer (A1-5).

In those cases where the polymer compound (A1) includes no structural unit (a1), such as the case of a polymer formed solely from the structural unit (a0), at least one of the aforementioned groups $R^2$ and $R^3$ must be an acid-dissociable, dissolution-inhibiting group.

Although there are no particular limitations on the weight average molecular weight (Mw) of the polymer compound (A1) (which is measured by gel permeation chromatography and referenced against polystyrene standards), in those cases where the resist composition of the present invention is a negative resist composition, the weight average molecular weight is preferably within a range from 1,000 to 8,000, more preferably from 2,000 to 7,000, and most preferably from 2,500 to 6,500. Further, in those cases where the resist composition of the present invention is a positive resist composition, the weight average molecular weight is preferably within a range from 3,000 to 50,000, more preferably from 4,000 to 30,000, and most preferably from 4,000 to 20,000. Provided the Mw value is not greater than the upper limit of the above ranges, the polymer compound (A1) exhibits satisfactory solubility in a resist solvent when used as a resist, whereas by making the Mw value at least as large as the lower limit of the above ranges, the dry etching resistance and cross-sectional shape of the resist pattern are favorable.

Further, the dispersity (Mw/Mn) is preferably within a range from 1.0 to 5.0, more preferably from 1.0 to 4.0, and most preferably from 1.2 to 3.8. Here, Mn is the number average molecular weight.

The polymer compound (A1) exhibits a property wherein the solubility of the compound in an alkali developing solution changes under the action of the acid generated from the component (B). For example, in those cases where the resist composition of the present invention is a negative resist composition, a polymer compound that is soluble in an alkali developing solution prior to exposure is used as the polymer compound (A1), and when acid is generated from the component (B) upon exposure, the action of that acid causes a cross-linking reaction between the polymer compound (A1) and a component (C) that is also included in the composition, thereby causing the polymer compound (A1) to change to a state that is insoluble in an alkali developing solution.

Furthermore, in those cases where the resist composition of the present invention is a positive resist composition, a polymer compound having acid-dissociable, dissolution-inhibiting groups, which exhibits increased solubility in an alkali developing solution under the action of acid is used as the polymer compound (A1). This type of polymer compound (A1) is insoluble in an alkali developing solution prior to exposure, but when acid is generated from the component (B) upon exposure, the action of that acid causes the acid-dissociable, dissolution-inhibiting groups to dissociate, resulting in an increase in the solubility of the polymer compound (A1) within an alkali developing solution.

[Production of Polymer Compound (A1)]

The polymer compound (A1) can be obtained, for example, by a conventional radical polymerization or the like of the monomers corresponding with each of the structural units, using a radical polymerization initiator such as dimethyl-2,2-azobis(2-methylpropionate) or azobisisobutyronitrile.

Furthermore, in the polymer compound (A1), by using a chain transfer agent such as HS—$CH_2$—$CH_2$—$CH_2$—C ($CF_3)_2$—OH, a —$C(CF_3)_2$—OH group can be introduced at the terminals of the component (A1). Such a copolymer having an introduced hydroxyalkyl group in which some of the hydrogen atoms of an alkyl group have been substituted with fluorine atoms is effective in reducing developing defects and LER (line edge roughness: unevenness of the side walls of a line pattern).

The polymer compound (A1) is a novel compound.

The monomer that yields the structural unit (a0) is a compound (hereafter referred to as "compound (I)") represented by general formula (I) shown below.

[Chemical Formula 49]

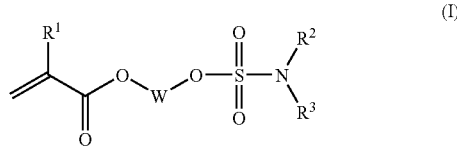

(I)

wherein $R^1$, $R^2$, $R^3$ and W are as defined above.

In formula (I), $R^1$, $R^2$, $R^3$ and W are as defined above for $R^1$, $R^2$, $R^3$ and W in general formula (a0-1).

Although there are no particular restrictions on the method used for producing the compound (I), in one example of a preferred method, an alcohol derivative represented by a general formula (III) shown below is added to a reaction system containing a compound represented by a general formula $XSO_2NR_2R_3$ (II) [wherein X represents a fluorine atom, chlorine atom, bromine atom or iodine atom, and $R^2$ and $R^3$ are as defined above], thus yielding the compound (I).

[Chemical Formula 50]

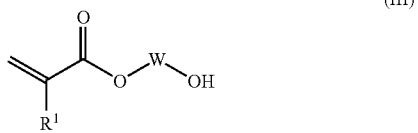

(III)

wherein $R^1$ and W are as defined above.

In formula (II), $R^2$ and $R^3$ are as defined above for $R^2$ and $R^3$ in formula (a0-1).

In formula (III), $R^1$ and W are as defined above for $R^1$ and W in formula (a0-1).

In a specific example of the method of producing the compound (I), 3-sulfamoyloxyadamantane-1-yl acrylate can be produced by reacting 3-hydroxyadamantane-1-yl acrylate with $ClSO_2NH_2$.

The structure of the compound obtained in the manner outlined above can be confirmed using typical organic analysis methods such as $^1H$ nuclear magnetic resonance (NMR) spectroscopy, $^{13}C$-NMR spectroscopy, $^{19}F$-NMR spectroscopy, infrared absorption (IR) spectroscopy, mass spectrometry (MS), elemental analysis methods, and X-ray diffraction techniques.

In the component (A), the polymer compound (A1) may be used as a single compound, or two or more compounds may be used in combination.

The resist composition of the present invention may contain only the polymer compound (A1) as the component (A), or may also include, in addition to the polymer compound (A1), another base component (hereafter referred to as "component (A2)") that is different from the polymer compound (A1).

In the component (A), the proportion of the polymer compound (A1) is preferably at least 50% by weight, more preferably within a range from 80 to 100% by weight, and is most preferably 100% by weight.

There are no particular restrictions on the component (A2), and any of the conventional compounds proposed as base components for chemically amplified resists may be selected and used.

There are no particular restrictions on the amount of the component (A) within the resist composition, which may be set appropriately in accordance with factors such as the desired film thickness for the resist film being formed. Generally, as the concentration of the component (A) within the organic solvent solution of the resist composition is increased, the film thickness of the formed resist film also increases.

<Component (B)>

As the component (B), there are no particular limitations, and any of the known acid generators used in conventional chemically amplified resist compositions can be used. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

As an onium salt-based acid generator, a compound represented by general formula (b-1) or (b-2) shown below can be used.

[Chemical Formula 51]

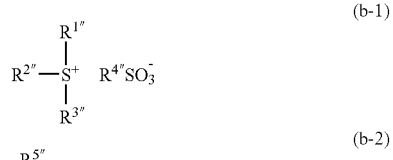

(b-1)

(b-2)

wherein $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom, and $R^{4''}$ represents a linear, branched or cyclic alkyl group or fluorinated alkyl group, with the provisos that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. In formula (b-1), two of $R^{1''}$ to $R^{3''}$ in formula (b-1) may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which some or all of the hydrogen atoms of the aryl group may or may not be substituted with alkyl groups, alkoxy groups, halogen atoms or hydroxyl groups. The aryl group is preferably an aryl group having 6 to 10 carbon atoms because it can be synthesized at a low cost. Specific examples thereof include a phenyl group and naphthyl group.

The alkyl group with which hydrogen atoms of the aryl group may be substituted is preferably an alkyl group having 1 to 5 carbon atoms, and is most preferably a methyl group, ethyl group, propyl group, n-butyl group, or tert-butyl group.

The alkoxy group with which hydrogen atoms of the aryl group may be substituted is preferably an alkoxy group having 1 to 5 carbon atoms, and is most preferably a methoxy group, ethoxy group, n-propoxy group, iso-propoxy group, n-butoxy group or tert-butoxy group.

The alkoxy group with which hydrogen atoms of the aryl group may be substituted is preferably an alkoxy group having 1 to 5 carbon atoms, and is most preferably a methoxy group or an ethoxy group The halogen atom with which hydrogen atoms of the aryl group may be substituted is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group, and decanyl group, and a methyl group is most preferable because it provides excellent resolution and can be synthesized at a low cost.

It is particularly desirable that each of $R^{1\prime\prime}$ to $R^{3\prime\prime}$ is a phenyl group or a naphthyl group.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3- to 10-membered ring including the sulfur atom, and it is particularly desirable that the two of $R^{1\prime\prime}$ to $R^{3\prime\prime}$ form a 5- to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. Examples of the aryl group include the same aryl groups as those exemplified above for $R^{1\prime\prime}$ to $R^{3\prime\prime}$.

$R^{4\prime\prime}$ represents a linear, branched or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and a fluorinated alkyl group in which all hydrogen atoms are substituted with fluorine atoms (i.e., a perfluoroalkyl group) is particularly desirable because the acid strength increases.

$R^{4\prime\prime}$ is most preferably a linear or cyclic alkyl group or a fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

Examples of the aryl group for $R^{5\prime\prime}$ and $R^{6\prime\prime}$ include the same aryl groups as those exemplified above for $R^{1\prime\prime}$ to $R^{3\prime\prime}$.

Examples of the alkyl group for $R^{5\prime\prime}$ and $R^{6\prime\prime}$ include the same alkyl groups as those exemplified above for $R^{1\prime\prime}$ to $R^{3\prime\prime}$.

It is particularly desirable that both of $R^{5\prime\prime}$ and $R^{6\prime\prime}$ represents a phenyl group.

Examples of $R^{4\prime\prime}$ in formula (b-2) include the same groups as those exemplified above for $R^{4\prime\prime}$ in formula (b-1).

Specific examples of the onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (and in which the cation moiety is the same as (b-1) or (b-2)) may also be used.

[Chemical Formula 52]

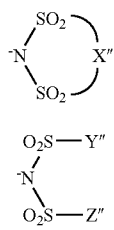

wherein X″ represents an alkylene group of 2 to 6 carbon atoms in which at least one hydrogen atom has been substituted with a fluorine atom, and Y″ and Z″ each independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y″ and Z″ independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms for the alkylene group for X″ or the alkyl group for Y″ and Z″ within the above-mentioned range of the number of carbon atoms, the more the solubility in a resist solvent is improved.

Further, in the alkylene group for X″ or the alkyl group for Y″ and Z″, it is preferable that the number of hydrogen atoms substituted with fluorine atoms is as large as possible because the acid strength increases and the transparency to high energy radiation of 200 nm or less or electron beam is improved. The amount of fluorine atoms within the alkylene group or alkyl group, namely the fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Furthermore, as the onium salt-based acid generator, a sulfonium salt having a cation moiety represented by general formula (b-5) or (b-6) shown below may also be used.

[Chemical Formula 53]

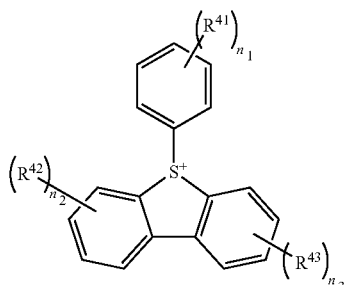

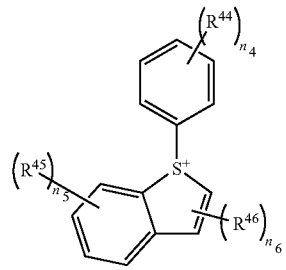

wherein $R^{41}$ to $R^{46}$ each independently represents an alkyl group, acetyl group, alkoxy group, carboxyl group, hydroxyl group or hydroxyalkyl group, $n_1$ to $n_5$ each independently represents an integer of 0 to 3, and $n_6$ represents an integer of 0 to 2.

In $R^{41}$ to $R^{46}$, the alkyl group is preferably an alkyl group of 1 to 5 carbon atoms, of these, is more preferably a linear or branched alkyl group, and is most preferably a methyl group, ethyl group, propyl group, isopropyl group, n-butyl group or tert-butyl group.

The alkoxy group is preferably an alkoxy group of 1 to 5 carbon atoms, of these, is more preferably a linear or branched alkyl group, and is most preferably a methoxy group or ethoxy group.

The hydroxyalkyl group is preferably a group in which one or more of the hydrogen atoms within an aforementioned alkyl group have been substituted with hydroxyl groups. Specific examples include a hydroxymethyl group, hydroxyethyl group and hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used in previously proposed onium salt-based acid generators may be used. Examples of such anion moieties include fluorinated alkylsulfonic acid ions such as the anion moiety ($R^{4″}SO_3^-$) shown above for the onium salt-based acid generators represented by general formula (b-1) or (b-2), and anion moieties represented by general formula (b-3) or (b-4) shown above. Among these, fluorinated alkylsulfonic acid ions are preferable, fluorinated alkylsulfonic acid ions of 1 to 4 carbon atoms are more preferable, and linear perfluoroalkylsulfonic acid ions of 1 to 4 carbon atoms are particularly desirable. Specific examples include a trifluoromethylsulfonic acid ion, heptafluoro-n-propylsulfonic ion and nonafluoro-n-butylsulfonic acid ion.

In the present description, an oxime sulfonate-based acid generator is a compound having at least one group represented by general formula (B-1) shown below, and has a feature of generating acid by irradiation. Such oxime sulfonate-based acid generators are widely used for chemically amplified resist compositions, and may be selected as appropriate.

[Chemical Formula 54]

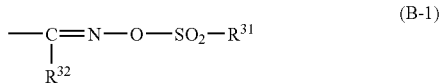

(B-1)

wherein $R^{31}$ and $R^{32}$ each independently represents an organic group.

The organic group for $R^{31}$ and $R^{32}$ refers to a group containing a carbon atom, and may include atoms other than carbon atoms (such as a hydrogen atom, oxygen atom, nitrogen atom, sulfur atom, or halogen atom (such as a fluorine atom or chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formulas (B-2) and (B-3) shown below.

[Chemical Formula 55]

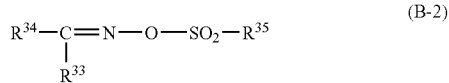

(B-2)

wherein $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 56]

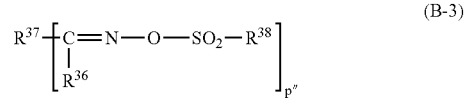

(B-3)

wherein $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group, and phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, still more preferably 90% or more fluorinated. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group for $R^{34}$.

As the alkyl group having no substituent or the halogenated alkyl group for $R^{38}$, the same groups as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 85) may be favorably used.

Furthermore, preferred examples include the compounds shown below.

[Chemical Formula 57]

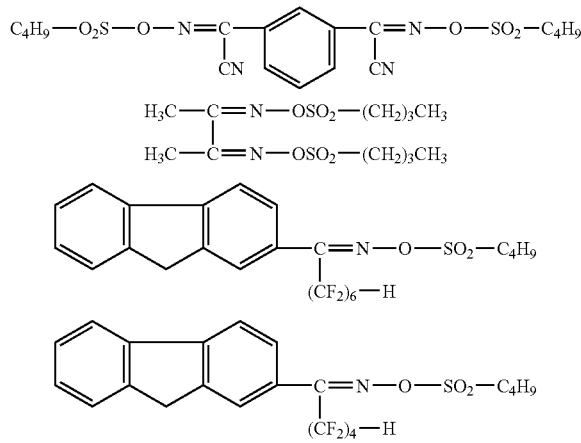

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be favorably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used, or two or more types may be used in combination.

In the present invention, of the various possibilities for the component (B), the use of an onium salt having a fluorinated alkylsulfonate ion as the anion is particularly preferred.

The amount of the component (B) within the resist composition of the present invention is typically within a range from 0.5 to 30 parts by weight, and preferably from 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (C)>

In those cases where the resist composition of the present invention is a negative resist composition, the resist composition preferably also includes the component (C).

There are no particular restrictions on the component (C), which may be selected appropriately from the various cross-linkers used within conventional chemically amplified negative resist compositions.

Specific examples include aliphatic cyclic hydrocarbons containing a hydroxyl group or a hydroxyalkyl group, or both or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups, as well as compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxymethylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical formula 58]

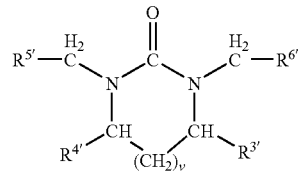

(C-1)

wherein $R^{5\prime}$ and $R^{6\prime}$ each independently represents a hydroxyl group or a lower alkoxy group, $R^{3\prime}$ and $R^{4\prime}$ each independently represents a hydrogen atom, a hydroxyl group or a lower alkoxy group, and v represents 0 or an integer of 1 to 2.

The lower alkoxy group for $R^{5\prime}$ and $R^{6\prime}$ may be either a linear or branched group, and is preferably an alkoxy group of 1 to 4 carbon atoms. $R^{5\prime}$ and $R^{6\prime}$ may be either the same or different, and are preferably the same.

The lower alkoxy group for $R^{3\prime}$ and $R^{4\prime}$ may be either a linear or branched group, and is preferably an alkoxy group of 1 to 4 carbon atoms. $R^{3\prime}$ and $R^{4\prime}$ may be either the same or different, and are preferably the same.

v is either 0 or an integer from 0 to 2, and is preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (C-1) can be obtained by a condensation reaction between an alkylene urea and formalin, or by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, or by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups are preferred. Including two or more epoxy groups improves the cross-linking reactivity.

The number of epoxy groups is preferably at least two, more preferably from 2 to 4, and is most preferably 2.

Preferred examples of the epoxy-based cross-linkers are shown below.

[Chemical formula 59]

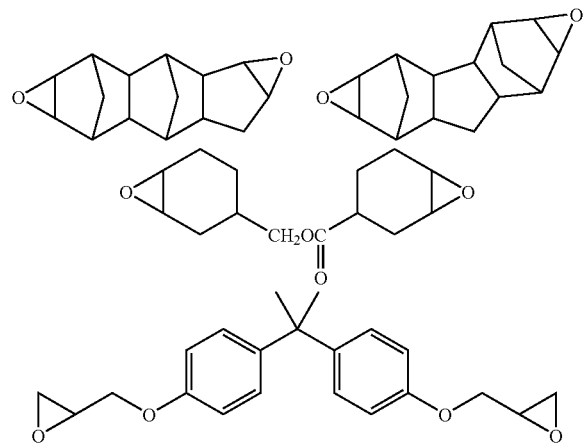

As the component (C), one type of cross-linker may be used, or two or more types may be used in combination.

As the component (C), the use of an amino-based cross-linker such as a glycoluril having a methylol group or alkoxymethyl group is usually preferred, as such compounds enable the formation of a resist pattern with minimal swelling.

The amount of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A). By ensuring that the quantity of the component (C) is at least as large as the lower limit of the above-mentioned range, the formation of cross-linking is able to proceed favorably, and a favorable resist pattern with minimal swelling is obtained. On the other hand, by ensuring that the quantity is not more than the upper limit of the above-mentioned range, the storage stability of the resist coating liquid improves, and deterioration in the sensitivity over time can be suppressed.

<Optional Components>

In order to improve factors such as the resist pattern shape and the post exposure stability of the latent image formed by the pattern-wise exposure of the resist layer, it is preferable that the resist composition of the present invention also includes a nitrogen-containing organic compound (D) (hereafter referred to as "component (D)") as an optional component.

A multitude of these components (D) have already been proposed, and any of these conventional compounds may be used, although an aliphatic amine, and particularly a secondary aliphatic amine or tertiary aliphatic amine is preferable. Here, an "aliphatic amine" refers to an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), as well as cyclic amines.

Specific examples include of alkylamines and alkyl alcohol amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, trialkylamines and alkyl alcohol amines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole, and derivatives thereof, as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{2-(2-hydroxyethoxy)ethoxy}ethyl]amine.

Any of the above compounds may be used alone, or two or more compounds may be used in combination.

The component (D) is typically used in an amount within a range from 0.01 to 5.0 parts by weight, relative to 100 parts by weight of the component (A).

Furthermore, in the resist composition of the present invention, in order to prevent any deterioration in sensitivity, and improve the resist pattern shape and the post exposure stability of the latent image formed by the pattern-wise exposure of the resist layer, at least one compound (E) (hereafter referred to as "component (E)") selected from the group consisting of organic carboxylic acids and phosphorus oxo acids and derivatives thereof may also be added as an optional component.

Examples of organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid, and among these, phosphonic acid is particularly desirable.

Examples of phosphorus oxo acid derivatives include esters in which a hydrogen atom within an above-mentioned oxo acid is substituted with a hydrocarbon group, and examples of the hydrocarbon group include alkyl groups of 1 to 5 carbon atoms and aryl groups of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of compound may be used, or two or more types may be used in combination.

As the component (E), an organic carboxylic acid is preferred, and salicylic acid is particularly desirable.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the coating properties, dissolution inhibitors, plasticizers, stabilizers, colorants, halation prevention agents, and dyes.

<Organic Solvent>

The resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more types of organic solvent can be appropriately selected from those that have been conventionally known as solvents for chemically amplified resists.

Examples of the organic solvent include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols such as ethylene glycol, diethylene glycol, propylene glycol and dipropylene glycol;

polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred];

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate;

aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; and dimethylsulfoxide (DMSO).

These solvents may be used individually, or as a mixed solvent containing two or more different solvents.

Of these solvents, propylene glycol monomethyl ether acetate (PGMEA), propylene glycol monomethyl ether (PGME), and EL are preferred.

Further, among the mixed solvents, a mixed solvent obtained by mixing PGMEA or PGME with a polar solvent is preferable. The mixing ratio (weight ratio) of the mixed solvent can be determined appropriately with due consideration of the compatibility of the PGMEA or PGME with the polar solvent, but is preferably within the range from 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. In such a case, the mixing ratio, reported as a weight ratio between the former and latter solvents, is preferably from 70:30 to 95:5.

Moreover, a mixed solvent of PGME and dimethylsulfoxide is also preferred. In such a case, the mixing ratio, reported as a weight ratio between the former and latter solvents, is preferably from 1:9 to 9:1, more preferably from 2:8 to 8:2, and is most preferably from 7:3 to 5:5.

The amount used of the component (S) is not particularly limited, and is adjusted appropriately to a concentration that enables application of the coating solution to a substrate in accordance with the desired thickness of the coating film. In general, the organic solvent is used in an amount that yields a solid content concentration for the resist composition that is within a range from 2 to 20% by weight, and preferably from 3 to 15% by weight.

<<Method of Forming Resist Pattern>>

The method of forming a resist pattern according to the present invention includes: forming a resist film on a substrate using the resist composition of the present invention described above; conducting exposure of the resist film; and developing the resist film to form a resist pattern.

The method of forming a resist pattern according to the present invention can be conducted, for example, in the manner described below.

In other words, a resist film is formed using the resist composition described above, the resist film is exposed, and the exposed resist film is then developed to form a resist pattern. Specifically, the resist composition described above is first applied to a substrate using a spinner or the like, and a prebake (post applied bake (PAB)) is conducted under temperature conditions of 80 to 150° C. for a period of 40 to 120 seconds, and preferably 60 to 90 seconds, to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, PEB (post exposure baking) is conducted under temperature conditions of 80 to 150° C. for 40 to 120 seconds, and preferably 60 to 90 seconds. Subsequently, alkali developing is conducted using an alkali developing solution such as a 0.1 to 10% by weight aqueous solution of tetramethylammonium hydroxide (TMAH), preferably followed by rinsing with pure water, and drying. If desired, an additional bake treatment (post bake) may be conducted following the developing. In this manner, a resist pattern that is faithful to the mask pattern can be obtained.

There are no particular limitations on the substrate, and conventional substrates can be used, including substrates for electronic components, and such substrates having wiring patterns formed thereon. Specific examples include metals such as silicon wafer, copper, chromium, iron and aluminum, and glass. Examples of materials that can be used for the wiring pattern include copper, aluminum, nickel and gold.

Further, as the substrate, any one of the above-exemplified substrates provided with an inorganic and/or organic film on the surface thereof may also be used. Examples of the inorganic film include inorganic anti-reflection films (inorganic BARC), whereas examples of the organic film include organic anti-reflection films (organic BARC).

The wavelength of the radiation used for exposure is not particularly limited, and the exposure can be conducted using radiation such as an ArF excimer laser, KrF excimer laser, $F_2$ excimer laser, EUV (extreme ultraviolet radiation), VUV (vacuum ultraviolet radiation), EB (electron beam), X-rays, and soft X-rays. The resist composition of the present invention is particularly effective for use with an ArF excimer laser.

The exposure of the resist film can be either a typical exposure (dry exposure) conducted in air or within an inert gas such as nitrogen, or an immersion exposure.

The resist composition of the present invention is a novel composition that has not been known until now.

Furthermore, according to the resist composition of the present invention, a resist pattern having excellent resolution can be formed.

The reasons that the effects described above are able to be achieved are not entirely clear, but it is thought that because the structural unit (a0) within the polymer compound (A1) includes the structure represented by $OSO_2N(R^2)R^3$ as a side-chain terminal, the polymer compound (A1) exhibits the required level of alkali solubility needed for either a positive resist composition or a negative resist composition, and furthermore, that because the W group (cyclic alkylene group) and the sulfamoyloxy group ($OSO_2N$ group) of the structural unit (a0) are both structures of comparatively superior transparency, the overall transparency of the polymer compound (A1), and particularly the transparency to light having a wavelength in the vicinity of 193 nm, is very high.

The present invention is particularly useful in those cases where the resist composition is a negative-type composition that includes a cross-linker component (C).

Conventionally, a polymer compound having fluorinated hydroxyalkyl groups has been used as the base component of a negative resist composition. These polymer compounds having fluorinated hydroxyalkyl groups are known to exhibit an appropriate level of alkali solubility. However, as a result of the steric hindrance caused by the fluorinated alkyl group, the hydroxyl groups of these fluorinated hydroxyalkyl groups do not contribute to the cross-linking reaction, meaning they tend to impede improvements in the cross-linking density.

In contrast, in the resist composition of the present invention, by including the polymer compound (A1) containing the structural unit (a0), not only does the composition exhibit excellent transparency in the wavelength vicinity of 193 nm and an appropriate level of alkali solubility as described above, but the side-chain terminal portion of the structural unit (a0) (namely, the $SO_2NH$ group or $SO_2NH_2$ group or the like) exhibits favorable reactivity with the component (C) (that is, favorable cross-linking reactivity), meaning the action of the acid generated from the component (B) upon exposure causes the formation of significant cross-linking between the polymer compound (A1) and the component (C). As a result, it is thought that when a negative resist pattern is formed, the cross-linking density of the exposed portions can be readily increased, enabling the alkali insolubility of the exposed portions of the resist composition to be significantly improved, thereby increasing the difference in the solubility of the exposed portions and the unexposed portions in the alkali developing solution (namely, the solubility contrast), and enabling the formation of a negative resist pattern of excellent resolution.

EXAMPLES

A more detailed description of the present invention is presented below using a series of examples, although the scope of the present invention is in no way limited by these examples.

Synthesis Example 1

Synthesis of 3-sulfamoyloxyadamantyl Acrylate

A 5-liter four-necked flask fitted with a thermometer, a dropping funnel and a stirrer was flushed with nitrogen, and was then charged with 980 g of heptane and 334 g (2.4 mol) of chlorosulfonyl isocyanate using the dropping funnel. The internal temperature was cooled to 5° C., and 110 g (2.4 mol) of formic acid was added dropwise from the dropping funnel at a rate that maintained the temperature inside the flask at 5 to 8° C. Following completion of the dropwise addition, the internal temperature was raised to 20° C., and the mixture was stirred for 10 hours. To the resulting mixed solution was added a solution containing 175 g (0.79 mol) of 3-hydroxyadamantyl acrylate, 525 g of N-methylpyrrolidone, 2.1 g of 4-methoxyphenol and 2.1 g of phenothiazine, with the addition performed via the dropping funnel at a rate that maintained the temperature inside the flask at a temperature of not more than 20° C. Following stirring for 3 hours at an internal temperature of 20 to 25° C., the reaction mixture was transferred to a separating funnel, and the upper layer was discarded. To the thus obtained lower layer were added 890 g of ethyl acetate and 700 g of water, and the resulting mixture was stirred, left to settle, and then separated. A further 890 g of ethyl acetate was then added to the water layer, and a second extraction was performed.

Following combination of the two ethyl acetate layers, the resulting solution was washed 5 times with 900 g samples of water. The washed solution was then washed with 400 g of a 7% by weight aqueous solution of sodium bicarbonate, and then 400 g of water. The thus obtained washed organic layer was concentrated under reduced pressure to obtain a concentrated solution of 500 g, and 630 g of toluene was added. The resulting solution was then heated to an internal temperature of 55° C., and then cooled to 3° C. to effect a recrystallization. Filtration of the thus obtained suspension yielded 145 g (0.48 mol) (yield=61%) of crystals of 3-sulfamoyloxyadamantyl acrylate, represented by the chemical formula shown below.

[Chemical Formula 60]

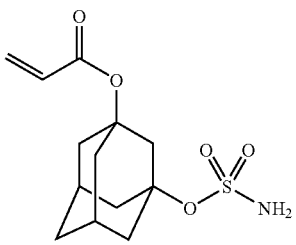

The results of $^1$H-NMR analysis of the obtained 3-sulfamoyloxyadamantyl acrylate are listed below.

$^1$H-NMR (300 MHz, DMSO-$d_6$, TMS, ppm) δ: 7.44 (2H, s), 6.26 (1H, m), 6.07 (1H, m), 3.34 (1H, s), 2.48 (3H, s), 2.34 (2H, s), 2.04 (6H, m), 1.52 (2H, s).

Synthesis Example 2

Synthesis of Polymer Compound (1)

A 100 ml four-necked flask fitted with a thermometer, a nitrogen inlet tube, a dropping funnel and a stirrer was charged with 13.0 g of propylene glycol monomethyl ether, and nitrogen from the nitrogen inlet tube was then bubbled through the liquid for 15 minutes. Subsequently, the internal temperature was raised to 80° C., and a solution containing 7.0 g (23 mmol) of 3-sulfamoyloxyadamantyl acrylate, 0.05 g (0.3 mmol) of azobisisobutyronitrile and 22.6 g of propylene glycol monomethyl ether was added gradually to the flask from the dropping funnel over a period of 3 hours. Following completion of the dropwise addition, the resulting mixture was stirred for 3 hours at a temperature of 80 to 83° C., and then cooled to 25° C. The resulting reaction mixture was then added dropwise to 309 g of diisopropyl ether. The precipitate that formed was filtered using a glass filter, the thus obtained powder was dissolved in 28 g of propylene glycol monomethyl ether, and the resulting solution was then added dropwise to a mixed solvent containing 136 g of diisopropyl ether and 15 g of ethyl acetate. The precipitate that formed was filtered using a glass filter, and the filtered powder was dried under reduced pressure at 40° C. for 8 hours. The product was 5.6 g (yield=80%) of a polymer (polymer compound (1)) represented by a formula (1) shown below, having a weight average molecular weight of 6,100 and a molecular weight dispersity of 1.35. In the formula below, the numerical value to the bottom right of the parentheses indicates the proportion (mol %) of that structural unit within the polymer.

[Chemical Formula 61]

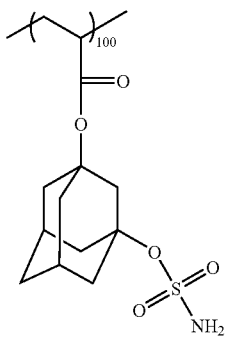

(1)

Synthesis Example 3

Synthesis of Polymer Compound (2)

A 100 ml four-necked flask fitted with a thermometer, a nitrogen inlet tube, a dropping funnel and a stirrer was charged with 14.8 g of propylene glycol monomethyl ether, and nitrogen from the nitrogen inlet tube was then bubbled through the liquid for 15 minutes. Subsequently, the internal temperature was raised to 80° C., and a solution containing 4.0 g (13.3 mmol) of 3-sulfamoyloxyadamantyl acrylate, 2.9 g (13.1 mmol) of 3-hydroxyadamantyl acrylate, 0.06 g (0.3 mmol) of azobisisobutyronitrile and 26.6 g of propylene glycol monomethyl ether was added gradually to the flask from the dropping funnel over a period of 3 hours. Following completion of the dropwise addition, the resulting mixture was stirred for 3 hours at a temperature of 80 to 83° C., and the reaction mixture was then added dropwise to 204 g of diisopropyl ether. The precipitate that formed was filtered using a glass filter, and the thus obtained powder was then redissolved in 20 g of propylene glycol monomethyl ether. The resulting solution was then added dropwise to a mixed solvent containing 117 g of diisopropyl ether and 13 g of ethyl acetate, the precipitate that formed was filtered using a glass filter, and the filtered solid was dried under reduced pressure, yielding 5.0 g (yield=72%) of a copolymer (polymer compound (2)) represented by a formula (2) shown below, having a weight average molecular weight of 5,600 and a molecular weight dispersity of 1.40. In the formula below, the numerical values to the bottom right of the parentheses indicate the proportions (mol %) of each structural unit within the copolymer.

[Chemical Formula 62]

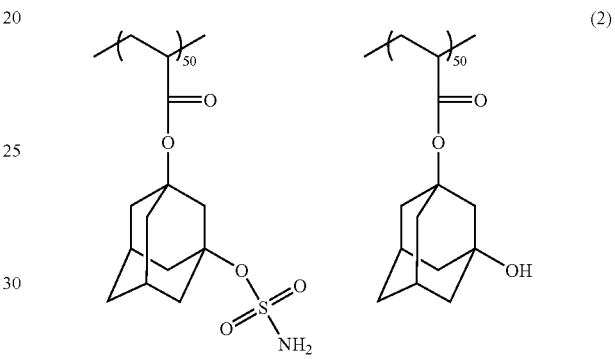

(2)

Synthesis Example 4

Synthesis of Polymer Compound (3)

A 200 ml four-necked flask fitted with a thermometer, a nitrogen inlet tube, a dropping funnel and a stirrer was charged with 33.2 g of propylene glycol monomethyl ether, and nitrogen from the nitrogen inlet tube was then bubbled through the liquid for 15 minutes. Subsequently, the internal temperature was raised to 78° C., and a solution containing 6.10 g (20.2 mmol) of 3-sulfamoyloxyadamantyl acrylate, 2.79 g (13.5 mmol) of adamantyl acrylate, 0.22 g (1.35 mmol) of azobisisobutyronitrile and 33.2 g of propylene glycol monomethyl ether was added gradually to the flask from the dropping funnel over a period of 3 hours. Following completion of the dropwise addition, the resulting mixture was stirred for 2 hours at a temperature of 78 to 80° C., and the reaction mixture was then added dropwise to 300 g of n-hexane. The supernatant liquid was removed by decantation, and the resulting precipitate was redissolved in 27.6 g of propylene glycol monomethyl ether. The resulting solution was then added dropwise to a mixed solvent containing 360 g of n-hexane and 40 g of isopropyl alcohol, the supernatant liquid was removed by decantation, and the resulting solid was dried under reduced pressure, yielding 6.2 g (yield=70%) of a copolymer (polymer compound (3)) represented by a formula (3) shown below, having a weight average molecular weight of 3,800 and a molecular weight dispersity of 1.48. In the formula below, the numerical values to the bottom right of the parentheses indicate the proportions (mol %) of each structural unit within the copolymer.

[Chemical Formula 63]

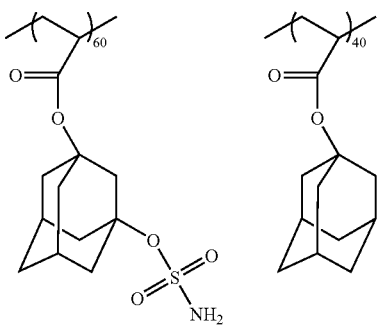

(3)

Synthesis Example 5

Synthesis of Polymer Compound (4)

A 200 ml four-necked flask fitted with a thermometer, a nitrogen inlet tube, a dropping funnel and a stirrer was charged with 23.3 g of propylene glycol monomethyl ether, and nitrogen from the nitrogen inlet tube was then bubbled through the liquid for 15 minutes. Subsequently, the internal temperature was raised to 78° C., and a solution containing 6.10 g (20.2 mmol) of 3-sulfamoyloxyadamantyl acrylate, 2.79 g (13.5 mmol) of adamantyl acrylate, 0.14 g (0.85 mmol) of azobisisobutyronitrile and 42.0 g of propylene glycol monomethyl ether was added gradually to the flask from the dropping funnel over a period of 3 hours. Following completion of the dropwise addition, the resulting mixture was stirred for 2 hours at a temperature of 78 to 80° C., and the reaction mixture was then added dropwise to 300 g of n-hexane. The supernatant liquid was removed by decantation, and the resulting precipitate was redissolved in 23.4 g of propylene glycol monomethyl ether. The resulting solution was then added dropwise to a mixed solvent containing 270 g of n-hexane and 30 g of isopropyl alcohol, the supernatant liquid was removed by decantation, and the resulting solid was dried under reduced pressure, yielding 3.7 g (yield=42%) of a copolymer (polymer compound (4)) represented by a formula (4) shown below, having a weight average molecular weight of 6,040 and a molecular weight dispersity of 1.37. In the formula below, the numerical values to the bottom right of the parentheses indicate the proportions (mol %) of each structural unit within the copolymer.

[Chemical Formula 64]

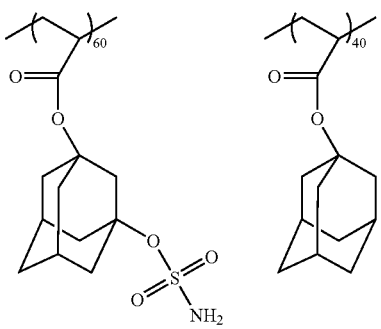

(4)

Synthesis Example 6

Synthesis of Polymer Compound (5)

A 200 ml four-necked flask fitted with a thermometer, a nitrogen inlet tube, a dropping funnel and a stirrer was charged with 37.0 g of propylene glycol monomethyl ether, and nitrogen from the nitrogen inlet tube was then bubbled through the liquid for 15 minutes. Subsequently, the internal temperature was raised to 80° C., and a solution containing 9.0 g (29.9 mmol) of 3-sulfamoyloxyadamantyl acrylate, 1.54 g (7.5 mmol) of adamantyl acrylate, 0.17 g (1.9 mmol) of azobisisobutyronitrile and 69.6 g of propylene glycol monomethyl ether was added gradually to the flask from the dropping funnel over a period of 3 hours. Following completion of the dropwise addition, the resulting mixture was stirred for 2 hours at a temperature of 80° C., and the reaction mixture was then added dropwise to 2,200 g of diisopropyl ether. The precipitate that formed was filtered using a glass filter, and the thus obtained solid was dried under reduced pressure, yielding 7.7 g (yield=73%) of a copolymer (polymer compound (5)) represented by a formula (5) shown below, having a weight average molecular weight of 4,300 and a dispersity of 1.31. In the formula below, the numerical values to the bottom right of the parentheses indicate the proportions (mol %) of each structural unit within the copolymer.

[Chemical Formula 65]

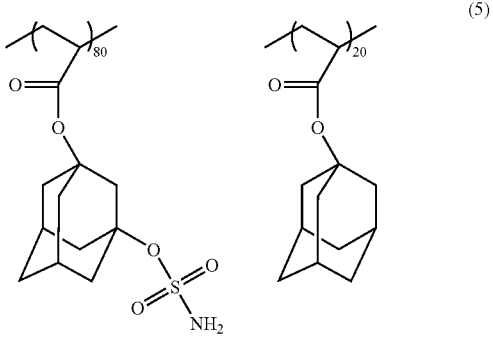

(5)

Examples 1 to 6

The components shown in Table 1 were mixed together and dissolved to prepare negative resist compositions.

TABLE 1

| | Component (A) | Component (B) | Component (C) | Component (D) | Component (S) |
|---|---|---|---|---|---|
| Example 1 | (A)-1 [100] | (B)-1 [2] | (C)-1 [5] | (D)-1 [0.4] | (S)-1 [2000] |
| Example 2 | (A)-2 [100] | (B)-1 [2] | (C)-1 [5] | (D)-1 [0.4] | (S)-1 [2000] |
| Example 3 | (A)-1' [100] | (B)-1 [2] | (C)-1 [5] | (D)-1 [0.4] | (S)-1 [2000] |
| Example 4 | (A)-3 [100] | (B)-1 [2] | (C)-1 [5] | (D)-1 [0.4] | (S)-1 [2000] |
| Example 5 | (A)-4 [100] | (B)-1 [2] | (C)-1 [5] | (D)-1 [0.4] | (S)-1 [2000] |
| Example 6 | (A)-5 [100] | (B)-1 [2] | (C)-1 [5] | (D)-1 [0.4] | (S)-1 [2000] |

The abbreviations used in Table 1 have the meanings shown below. Further, the numerical values within the brackets [ ] represent blend amounts (parts by weight).

(A)-1: the polymer compound (1)
(A)-2: the polymer compound (2)
(A)-1': a polymer of the above formula (1) having a weight average molecular weight of 5,000
(A)-3: the polymer compound (3)
(A)-4: the polymer compound (4)
(A)-5: the polymer compound (5)
(B)-1: triphenylsulfonium trifluoromethanesulfonate
(C)-1: a compound represented by chemical formula (C)-1 shown below (tetramethoxymethylated glycoluril, product name: NIKALAC MX-270, manufactured by Sanwa Chemical Co., Ltd.)
(D)-1: triisopropanolamine
(S)-1: propylene glycol monomethyl ether (PGME)

[Chemical Formula 66]

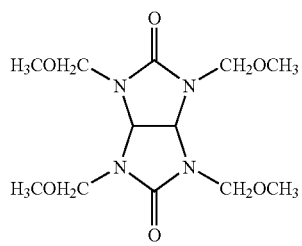

(C)-1

Using the obtained resist compositions, the following evaluations were performed.

[Evaluation of Residual Film Properties]

An organic anti-reflection film composition ARC29 (a product name, manufactured by Brewer Science Ltd.) was applied uniformly onto an 8-inch silicon wafer using a spinner, and the composition was then baked on a hotplate at 205° C. for 60 seconds, thereby forming an organic anti-reflection film having a film thickness of 77 nm.

The resist composition obtained above was then applied onto the organic anti-reflection film using a spinner, and was then prebaked (PAB) and dried on a hotplate at 90° C. for 60 seconds, thus forming a resist film having a film thickness of 160 nm.

Using an ArF exposure apparatus NSR-S302 (a product name, manufactured by Nikon Corporation, NA (numerical aperture)=0.60, ⅔ annular illumination), the resist film was then irradiated with an ArF excimer laser (193 nm) using an exposure dose of 0 to 30 mJ/cm². Subsequently, a post exposure baking (PEB) treatment was conducted at 110° C. for 60 seconds, and the resist film was then developed for 60 seconds at 23° C. in a 2.38% by weight aqueous solution of tetramethylammonium hydroxide (TMAH). The resist film was then washed with water for 30 seconds and dried.

Based on the changes in the residual film ratio (units: %, resist film thickness following developing/resist film thickness upon film deposition (prior to exposure)×100) resulting from the change in the exposure dose, a residual film curve was prepared. These results revealed that all of the resist compositions from examples 1 to 6 exhibited favorable contrast. Furthermore, the maximum residual film ratios (the convergence values for the residual film ratio) were example 1 (73%), example 2 (96%), example 3 (70%), example 4 (99.6%), example 5 (60%) and example 6 (100%).

The above results confirmed that the resist compositions of examples 1 to 6 exhibited excellent residual film properties, and were able to function as negative resist compositions.

[Evaluation of Lithography Properties]

An organic anti-reflection film composition ARC29 (a product name, manufactured by Brewer Science Ltd.) was applied uniformly onto an 8-inch silicon wafer using a spinner, and the composition was then baked on a hotplate at 205° C. for 60 seconds, thereby forming an organic anti-reflection film having a film thickness of 77 nm.

The resist composition of example 2 was then applied onto the organic anti-reflection film using a spinner, and was then prebaked (PAB) and dried on a hotplate at 90° C. for 60 seconds, thus forming a resist film having a film thickness of 160 nm.

Using an ArF exposure apparatus NSR-S302 (a product name, manufactured by Nikon Corporation, NA (numerical aperture)=0.60, ⅔ annular illumination), the resist film was then selectively irradiated with an ArF excimer laser (193 nm) through a mask pattern. Subsequently, a PEB treatment was conducted at 110° C. for 60 seconds, and the resist film was then developed for 60 seconds at 23° C. in a 2.38% by weight aqueous solution of tetramethylammonium hydroxide (TMAH). The resist film was then washed with water for 30 seconds and dried.

The results confirmed the resolution of a line and space pattern (LS pattern) having a line width of 250 nm and a pitch of 500 nm.

The optimum exposure dose Eop (mJ/cm²) at which the LS pattern having a line width of 250 nm and a pitch of 500 nm was formed was determined as the "sensitivity." The result revealed an Eop value of 35 mJ/cm² for example 2.

Further, the "resolution" was determined by using a measuring SEM (scanning electron microscope) S-9220 (manufactured by Hitachi Ltd.) to determine the critical resolution (nm) at the above Eop value. The result revealed a critical resolution for example 2 of 150 nm.

The above results confirmed that the resist composition of the present invention is able to be used for lithography applications, and exhibits favorable lithography properties.

The invention claimed is:

1. A resist composition comprising a base component (A) that exhibits changed solubility in an alkali developing solution under action of acid, and an acid generator component (B) that generates acid upon exposure, wherein
said base component (A) comprises a polymer compound (A1) having a structural unit (a0) represented by general formula (a0-1) shown below:

[Chemical Formula 1]

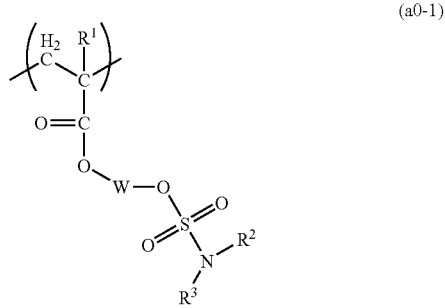

(a0-1)

wherein R¹ represents a hydrogen atom, an alkyl group of 1 to 5 carbon atoms or a fluorinated alkyl group of 1 to 5 carbon atoms, $R^2$ and $R^3$ each independently represents a hydrogen atom or an alkyl group that may include an oxygen atom at an arbitrary position, or $R^2$ and $R^3$ are bonded together to form an alkylene group, and W represents a cyclic alkylene group that may include an oxygen atom at an arbitrary position.

2. A resist composition according to claim 1, wherein said polymer compound (A1) further comprises a structural unit (a3) that is different from said structural unit (a0), and is derived from an acrylate ester that contains a polar group-containing aliphatic hydrocarbon group.

3. A resist composition according to claim 2, wherein said structural unit (a3) is a structural unit (a'3) derived from an acrylate ester that contains a hydroxyl group-containing aliphatic cyclic group, and/or a structural unit (a''3) derived from an acrylic acid having no cyclic structures and having an alcoholic hydroxyl group on a side chain.

4. A resist composition according to claim 1, wherein said polymer compound (A1) further comprises a structural unit (a4) derived from a non-acid-dissociable cyclic alkyl acrylate ester.

5. A resist composition according to claim 1 which is a negative resist composition.

6. A resist composition according to claim 5, further comprising a cross-linker component (C).

7. A resist composition according to claim 1, further comprising a nitrogen-containing organic compound (D).

8. A method of forming a resist pattern, comprising: forming a resist film on a substrate using a resist composition according to claim 1, conducting exposure of said resist film, and developing said resist film to form a resist pattern.

* * * * *